(12) United States Patent
Takahashi

(10) Patent No.: US 8,013,378 B2
(45) Date of Patent: Sep. 6, 2011

(54) MEMORY DEVICE HAVING ADDITIONAL SELECTION TRANSISTORS AND MAIN BIT LINES

(75) Inventor: Keita Takahashi, Toyama (JP)

(73) Assignee: Panasonic Corporation, Osaka (JP)

( * ) Notice: Subject to any disclaimer, the term of this patent is extended or adjusted under 35 U.S.C. 154(b) by 331 days.

(21) Appl. No.: 12/270,170

(22) Filed: Nov. 13, 2008

(65) Prior Publication Data
US 2009/0121281 A1   May 14, 2009

(30) Foreign Application Priority Data

Nov. 14, 2007 (JP) ................................. 2007-295491

(51) Int. Cl.
*H01L 27/108* (2006.01)
(52) U.S. Cl. ................ 257/311; 257/324; 257/E29.309; 365/185.16
(58) Field of Classification Search .................. 257/311, 257/E29.309, 324, 315; 365/185.28
See application file for complete search history.

(56) References Cited

U.S. PATENT DOCUMENTS

| | | | |
|---|---|---|---|
| 5,610,420 A | 3/1997 | Kuroda et al. | |
| 5,963,465 A | 10/1999 | Eitan | |
| 6,351,415 B1 | 2/2002 | Kushnarenko | |
| 6,633,496 B2 | 10/2003 | Maayan et al. | |
| 6,975,536 B2 | 12/2005 | Maayan et al. | |
| 7,755,938 B2 * | 7/2010 | Atir et al. .................. | 365/185.02 |
| 2005/0180212 A1 * | 8/2005 | Kojima et al. ........... | 365/185.11 |

* cited by examiner

*Primary Examiner* — Wael Fahmy
*Assistant Examiner* — John C Ingham
(74) *Attorney, Agent, or Firm* — McDermott Will & Emery LLP

(57) ABSTRACT

A semiconductor memory device has an element isolation region between rewrite units of memory cells. A plurality of memory cells are memory cell groups arranged in a row direction, and each memory cell group consists of (8×N) memory cells arranged in a row direction as a unit to be used as a storage region. The number of a plurality of selection word lines is at least eight, and the number of selection transistors corresponding to at least N is connected to each of the plurality of selection word lines. At least one selection transistor in addition to (8×N) selection transistors are connected in total to the plurality of selection word lines. A plurality of main bit lines includes at least one main bit line in addition to (4×N) main bit lines connected to the common drain of a pair of selection transistors.

8 Claims, 20 Drawing Sheets

MEMORY CHIP

MEMORY CHIP

MEMORY DEVICE HAVING ADDITIONAL SELECTION TRANSISTORS AND MAIN BIT LINES

BACKGROUND OF THE INVENTION

1. Field of the Invention

The present invention relates to a semiconductor memory device. More particularly, the present invention relates to a MONOS (Metal-Oxide-Nitride-Oxide-Silicon) memory.

2. Related Art

With recent improvement in integration and reduction in cost of nonvolatile semiconductor memory devices, a local trap MONOS memory having a virtual ground array for locally trapping charges has been proposed.

Due to the virtual ground array, the local trap MONOS memory is characterized in its operation through selection transistors. An arranging method or driving method of the selection transistors is therefore important for the local trap type MONOS memory.

Hereinafter, the structure and operation of a conventional nonvolatile semiconductor memory device will be described with reference to the accompanying drawings (e.g., see U.S. Pat. No. 5,963,465).

First, the structure of a conventional nonvolatile semiconductor memory device will be described with reference to FIGS. 13 through 17.

FIG. 13 is a cross-sectional view of MONOS memory cells.

As shown in FIG. 13, a plurality of bit line diffusion layers 2 are provided at intervals on a semiconductor substrate 1. A charge trap film (ONO (Oxide-Nitride-Oxide) insulating film) 3 and a gate electrode 4 are sequentially formed over the semiconductor substrate 1 between the bit line diffusion layers 2. A bit line insulating film 10 is formed on the bit line diffusion layers 2. Note that the gate electrode 4 is formed also on the bit line insulating film 10 and extends in X direction (the left-right direction in the figure). The bit line diffusion layers 2 extend in Y direction (the direction vertical to the plane of the figure).

FIG. 14 is a circuit diagram of a memory array.

As shown in FIG. 14, selection transistors 6 are provided above and below memory cells 5. Each memory cell 5 have its gate electrode 4 connected to a corresponding memory word line (WL0, WL1) extending in X direction (the left-right direction in the figure). Although about 64 to 512 memory word lines are typically provided in Y direction (the up-down direction in the figure) between the selection transistors 6, only two memory word lines (WL0, WL1) are shown herein for convenience of explanation. Each selection transistor 6 is a transistor having a typical MOS structure and is formed by the gate electrode 4 common to the memory cells 5, a gate insulating film specific to the selection transistors 6, a source, a drain, and the like. Note that the gate electrode 4 of the selection transistors may be made of a different material from that of the gate electrode 4 of the memory cells 5.

A total of eight selection transistors 6 are provided above and below eight memory cells 5 arranged in X direction. The gate electrode 4 of each selection transistor 6 is connected to a corresponding one of selection word lines (SL-0 to SL-7) extending in X direction. A main bit line (MBL-0 to MBL-15) extending in Y direction is provided for every two memory cells 5 arranged in X direction, and is connected to the drain shared by two selection transistors 6. Note that, although about 1K main bit lines are typically provided in X direction, only 16 main bit lines (MBL-0 to MBL-15) are shown herein for convenience of explanation. Although FIG. 14 does not show connection between the main bit lines (MBL-0 to MBL-15) and the selection transistors 6, this connection is shown in FIG. 15 described below.

FIG. 15 is a partial enlarged view of FIG. 14 and shows connection between the main bit lines (MBL-0 to MBL-15) and the selection transistors 6.

As shown in FIG. 15, each main bit line is connected to the drain common to two selection transistors 6 and is connected to the bit line diffusion layers (source/drain) 2 (see FIG. 1) of the memory cells 5 through the selection transistors 6. Four main bit lines are thus provided for every eight memory cells 5 and are connected to eight bit line diffusion layers 2 through eight selection transistors 6.

FIG. 16 is an enlarged view of the array portion of the memory cells 5 shown in FIG. 14.

As shown in FIG. 16, the gate electrode of each memory cell 5 is connected to a corresponding one of memory word lines (WL0 to WL6) extending in X direction (the left-right direction in the figure), and the bit line diffusion layers 2 serving as the sources and drains of the memory cells 5 extend in Y direction (the up-down direction in the figure) to form diffusion layer bit lines (DBL-0 to DBL-20). Note that, in FIG. 16, twenty memory cells 5 are arranged in X direction and seven memory cells 5 are arranged in Y direction. Such a structure is arranged in a matrix pattern to form an array.

FIG. 17 shows a planar layout corresponding to the circuit diagram of the memory cell shown in FIG. 14. Note that FIG. 17 shows a half of the structure in the left-right direction in FIG. 14. In other words, FIG. 17 shows a region corresponding to the selection word lines (SL-0 to SL-7) and the main bit lines (MBL-0 to MBL-7).

As shown in FIG. 17, memory cells 5 formed by an active region (thin film region) 7, the bit line diffusion layers 2, and the gate electrode 4 are arranged in the left-right direction in the figure in a central region of the up-down direction in the figure. The selection transistors 6 formed by the active region 7 and the gate electrode 4 are provided above and below the memory cells 5. Each main bit line is connected to the active region 7 (drain) common to two selection transistors 6 through an MBL contact 9.

Hereinafter, operation of the conventional nonvolatile semiconductor memory device will be described with reference to FIGS. 18 through 24.

FIG. 18 shows a circuit diagram of write operation, and FIG. 19 is a corresponding cross-sectional view of memory cells in write operation.

As shown in FIG. 18, +9 V is applied to the memory word line WL, +5 V is applied to the bit line diffusion layer 2 on the right side of the memory cell 5 (Cell-2), and 0 V is applied to the bit line diffusion layer 2 on the left side of the memory cell 5 (Cell-2). The other bit line diffusion layers 2 are in an open state. As shown in FIG. 19, electrons a are thus injected to the right end of the charge trap film 3 of the memory cell 5 (Cell-2).

FIG. 20 is a circuit diagram of erase operation, and FIG. 21 is a corresponding cross-sectional view of memory cells in erase operation.

As shown in FIG. 20, −5 V is applied to the memory word line WL and +5 V is applied to the bit line diffusion layer 2 on the right side of the memory cell 5 (Cell-2). The other bit line diffusion layers 2 are in an open state. As show in FIG. 21, holes b are thus injected to the right end of the charge trap film 3 of the memory cell 5 (Cell-2) and the left end of the charge trap film 3 of the memory cell 5 (Cell-3).

FIG. 22 is a circuit diagram of read operation, and FIG. 23 is a corresponding cross-sectional view of memory cells in read operation.

As shown in FIG. 22, +5 V is applied to the memory word line WL, 0 V is applied to the bit line diffusion layer 2 on the right side of the memory cell 5 (Cell-2), and +1 V is applied to the bit line diffusion layer 2 on the left side of the memory cell 5 (Cell-2). The other bit line diffusion layers 2 are in an open state. As show in FIG. 23, in the case where electrons a have been injected to the right end of the charge trap film 3 of the memory cell 5 (Cell-2), a threshold voltage increases and therefore a small current flows between the source and drain of the memory cell 5 (Cell-2). In the case where holes b have been injected to the right end of the charge trap film 3 of the memory cell 5 (Cell-2), on the other hand, the threshold voltage decreases and therefore a large current flows between the source and drain of the memory cell 5 (Cell-2). Whether the memory cell 5 is in a written state or an erased state can thus be determined by comparing the source-drain current of the memory cell 5.

In each memory cell 5, the respective charge states of the right and left ends of the charge trap film 3 can be independently controlled. Therefore, a 2-bit state can be stored in each memory cell.

FIG. 24 is a circuit operation diagram corresponding to FIG. 16, illustrating a read state including the selection transistors 6. FIG. 24 shows an example of reading the charge state at the right end of the charge trap film 3 in the fourth memory cell 5 from the left in the figure.

As shown in FIG. 24, in order to apply +1 V to the left bit line diffusion layer 2 of the fourth memory cell 5 from the left, +1 V is applied to the main bit line (MBL-3) and 5 V is applied to the selection word line (SL-1) to turn on the selection transistor 6 having the gate electrode 4 connected to the selection word line (SL-1). In this way, +1 V applied to the main bit line (MBL-3) is transmitted to the source of the turned-on selection transistor 6, and +1 V is transmitted to the bit line diffusion layer 2 on the left side of the fourth memory cell 5 from the left connected to the source of the turned-on selection transistor 6. Similarly, in order to apply 0 V to the bit line diffusion layer 2 on the right side of the fourth memory cell 5 from the left, 0 V is applied to the main bit line (MBL-0) and 5 V is applied to the selection word line (SL-5) to turn on the selection transistor having the gate electrode 4 connected to the selection word line (SL-5). In this way, 0 V applied to the main bit line (MBL-0) is transmitted to the source of the turned-on selection transistor 6, and 0 V is transmitted to the bit line diffusion layer 2 on the right side of the fourth memory cell 5 from the left connected to the source of the turned-on selection transistor 6.

The potential state of a plurality of bit line diffusion layers 2 can thus be controlled by varying an applied voltage to the four main bit lines and eight selection word lines.

In a nonvolatile memory, the unit of memory capacity that can be rewritten (hereinafter, rewrite unit) is limited by a user's request and the like. In general, a smaller rewrite unit is better for the user in terms of usability. However, the smaller the rewrite unit is, the larger the area of the memory array becomes.

Hereinafter, a conventional method for reducing the rewrite unit in a MONOS memory having a virtual ground array for locally trapping charges will be described with reference to the figures.

In a MONOS memory having a virtual ground array, not only the selected memory cell 5 (Cell-2) but adjacent memory cells 5 (Cell-0, 1, 3, 4, 5, etc.) connected to the same memory word line WL are turned on in the written state shown in FIG. 18. Therefore, although a write current is shown to flow only in the selected memory cell 5 (Cell-2) in FIG. 18, a small current actually flows also in the adjacent memory cells 5 (Cell-0, 1, 3, 4, 5, etc.) connected to the same memory word line WL. These non-selected memory cells 5 are therefore brought into a slightly written state (this is generally called a write disturb phenomenon).

If the memory cell group belongs to the same rewrite unit, for example, if the adjacent memory cells belong to the same write unit, this write disturb occurs one to several times. However, if the memory cells belong to different rewrite units, for example, if one memory cell belong to a unit to be written and an adjacent memory cell belongs to a unit in an erased state, the write disturb may occur about ten thousand to a hundred thousand times in the unit in the erased state, whereby the unit changes from the erased state to the written state. In other words, data is destroyed.

In order to prevent such a write disturb phenomenon from occurring in a memory cell group belonging to different rewrite units, a structure for electrically dividing a virtual ground array into rewrite units has been proposed (e.g., see U.S. Pat. No. 6,975,536).

FIG. 25 schematically shows a chip layout obtained by dividing a virtual ground array by using X decoders (a decoder for driving memory word lines WL).

As shown in FIG. 25, in this method, one X decoder and one Y decoder are required for every rewrite unit, thereby increasing the chip size. Note that division in Y direction can be performed based on the selection transistors.

FIG. 26 schematically shows a chip layout obtained by dividing a virtual ground array within a memory cell array.

As shown in FIG. 26, since an X decoder and a Y decoder can be shared by a plurality of rewrite units, increase in chip size can be suppressed.

Referring to FIGS. 25 and 26, four X decoders are required in FIG. 25, while only one in FIG. 26. Since the X decoder of FIG. 26 needs to drive a larger memory word line capacity, the X decoder of FIG. 26 is larger in size than the X decoder in FIG. 25. However, the total X decoder area is smaller in FIG. 26 than in FIG. 25. Since approximately the same Y decoders can be used in both FIGS. 25 and 26 and the number of X decoders is smaller in FIG. 26 than in FIG. 25, a required chip size is smaller in FIG. 26 than in FIG. 25.

More specifically, provided that the area of each memory array 1, 2, 3, 4 in FIG. 25 is 1.0, the area of each X decoder 1, 2, 3, 4 is 0.3, and the area of each Y decoder 1, 2, 3, 4 is 0.3 in FIG. 25, the memory chip area in FIG. 25 is 1×4+0.3×4+0.3×4=6.4. On the other hand, provided that the area of each memory array 1, 2, 3, 4 is 1.0, the area of the X decoder is 0.6, and the area of the Y decoder is 0.3 in FIG. 26, the memory chip area in FIG. 26 is 1×4+0.6+0.3×4=6.4. The memory chip area ratio of FIG. 25 to FIG. 26 is 4.9/6.4. It can therefore be found that the area of FIG. 26 is 77% smaller than that of FIG. 25.

FIG. 27 is a circuit diagram illustrating write operation in the virtual ground array divided within the memory cell array as shown in FIG. 26.

As shown in FIG. 27, memory cells 5 (Cell-13 to 15) belong to a different rewrite unit from that of memory cells 5 (Cell-16 to 17). Since the bit line diffusion layer 2 on the right side of the memory cell 5 (Cell-15) is electrically isolated from the bit line diffusion layer 2 on the left side of the memory cell 5 (Cell-16), the write disturb phenomenon does not occur.

FIG. 28 shows a memory array circuit diagram in the case where the virtual ground array is divided within the memory cell array. In order to perform electrical isolation as described with reference to FIG. 27, the memory cells 5 are divided into groups of 16 memory cells so that the memory cell groups are electrically isolated from each other by an element isolation region 8.

FIG. 29 is a cross-sectional view of memory cells corresponding to a part of the circuit diagram of FIG. 28.

As shown in FIG. 29, the element isolation region 8 described with reference to FIG. 28 is provided between adjacent bit line diffusion layers 2. Note that this element isolation region 8 may be provided under the charge trap film 3, and a dummy memory cell 5 that is not used as an actual storage region may be provided in the element isolation region 8 for stable processing or the like.

FIG. 30 is an enlarged view of an array portion of the memory cells 5 in the circuit diagram of FIG. 28.

As shown in FIG. 30, the element isolation region 8 is provided for every memory cell group consisting of 16 memory cells 5. The element isolation region 8 is formed by forming an element isolation groove by using, for example, a shallow trench isolation method, a LOCOS (local oxidation of silicon) method or the like, and embedding a silicon oxide film or the like in the element isolation groove.

As has been described above, the chip layout obtained by dividing the virtual ground array within the memory cell array avoids the write disturb phenomenon by forming the element isolation region, and suppresses increase in chip size.

SUMMARY OF THE INVENTION

However, the conventional structure in which the element isolation region is provided between the memory cell groups of rewrite units has the following problem: when the same wiring structure as that shown in FIG. 14 is used as shown in FIG. 28, a wiring for controlling the bit line diffusion layer 2 of the sixteenth memory cell 5 separated by the element isolation region 8 (the sixteenth memory cell 5 from the left in FIG. 28) cannot be provided, and this bit line diffusion layer 2 cannot be driven. Even if this bit line diffusion layer 2 is connected to the source of any of the selection transistors 6, wrong operation such as wrong writing, wrong erasure, or wrong reading may occur. In other words, the method using the structure of FIG. 28 cannot control the potential of all the bit line diffusion layers 2 required for operation by the selection transistors 6.

In view of the above problem, it is an object of the present invention to provide a semiconductor memory device having an element isolation region provided between memory cell groups of rewrite units and being capable of controlling the potential of all the bit line diffusion layers required for operation by selection transistors.

In order to achieve the above object, a semiconductor memory device according to one aspect of the invention includes a memory cell array. The memory cell array includes in a region defined by an element isolation region in a substrate: a plurality of bit line diffusion layers extending in a column direction in the substrate to form sub bit lines; a plurality of word lines extending in a row direction over the substrate so as to cross the plurality of bit line diffusion layers; a plurality of memory cells each formed by a pair of bit line diffusion layers located adjacent to each other, a word line crossing a region interposed between the pair of bit line diffusion layers, and a gate insulating film formed between the substrate and the word line, and each sharing one of the plurality of bit line diffusion layers with an adjacent memory cell; a plurality of selection word lines extending in the row direction; a plurality of main bit lines extending in the column direction; and a plurality of selection transistors each having its gate connected to one of the plurality of selection word lines, its source connected to one of the plurality of bit line diffusion layers, and its drain connected to one of the plurality of main bit lines, for selecting any of the plurality of memory cells. The plurality of memory cells are memory cell groups arranged in the column direction, each memory cell group consisting of (8×N) (where N is a natural number) memory cells arranged in the row direction as a unit to be used as a storage region. The number of the plurality of selection word lines is at least eight. The number of selection transistors corresponding to at least N is connected to each of the plurality of selection word lines, and at least one selection transistor in addition to (8×N) selection transistors are connected in total to the plurality of selection word lines. The (8×N) selection transistors of the plurality of selection transistors are formed by a pair of selection transistors having their respective gates connected to different selection word lines and having a common drain. The plurality of main bit lines includes at least one main bit line in addition to (4×N) main bit lines connected to the common drain of the pair of selection transistors. Each bit line diffusion layer of the plurality of memory cells is connected to the source of a corresponding one of the plurality of selection transistors.

In the semiconductor memory device of the one aspect of the invention, the number of the plurality of selection word lines may be L=9 or 10, the number of the plurality of selection transistors may be ((8×N)+1) to (L×N), and the number of the plurality of main bit lines may be ((4×N)+1) to (L×N)/2.

In the semiconductor memory device of the one aspect of the invention, the number of the plurality of selection word lines may be 8, the number of the plurality of selection transistors may be ((8×N)+1) to ((8×N)+8), and the number of the plurality of main bit lines may be ((4×N)+1) to ((4×N)+4).

In the semiconductor memory device of the one aspect of the invention, the plurality of memory cells may include at least one dummy cell that is not used as the storage region in each of the plurality of memory cell groups.

In the semiconductor memory device of the one aspect of the invention, the at least one dummy cell may be provided at one end of each of the plurality of memory cell groups.

In the semiconductor memory device of the one aspect of the invention, the at least one dummy cell may be two or more dummy cells and may be provided at both ends of each of the plurality of memory cell groups.

In the semiconductor memory device of the one aspect of the invention, the at least one dummy cell may be structured to be driven.

In the semiconductor memory device of the one aspect of the invention, the gate insulating film may be a film having a charge trap function, and a gate electrode of the plurality of memory cells may function as a part of the word lines.

The semiconductor memory device of the present invention is capable of controlling the potential of all the bit line diffusion layers required for operation by the selection transistors in the case where the element isolation region is provided between the rewrite units of the memory cells. As a result, dividing into the rewrite units can be performed within a memory cell array having a pair of X decoder and Y decoder, whereby smaller rewrite units can be implemented with a small memory core area.

DETAILED DESCRIPTION OF THE PREFERRED EMBODIMENTS

First Embodiment

Hereinafter, a semiconductor memory device and a driving method thereof according to a first embodiment of the present invention will be described with reference to the accompanying drawings.

Figure 1:
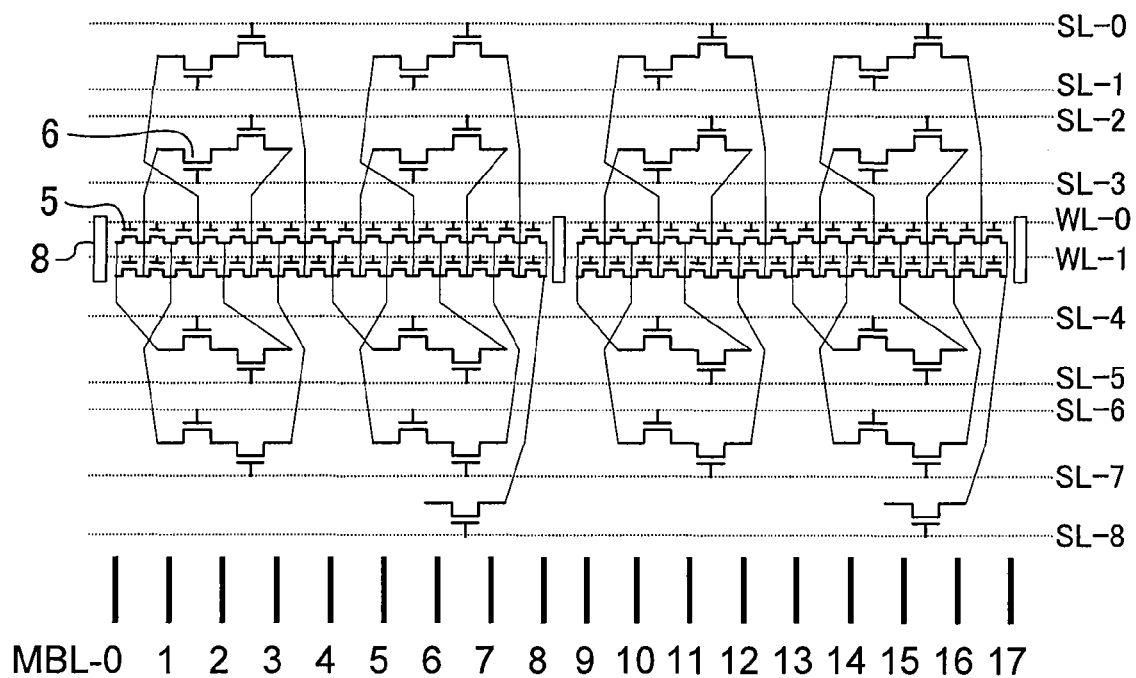
FIG. 1 is a circuit diagram of a memory array according to a first embodiment of the present invention.
Figure 29:
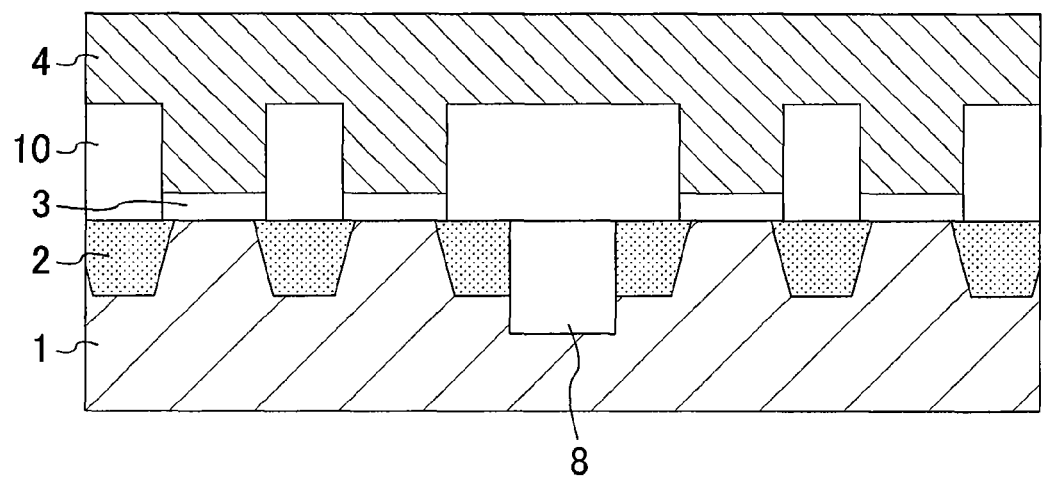
FIG. 29 is a cross-sectional view of memory cells corresponding to a part of the circuit diagram of the memory array.
Figure 30:
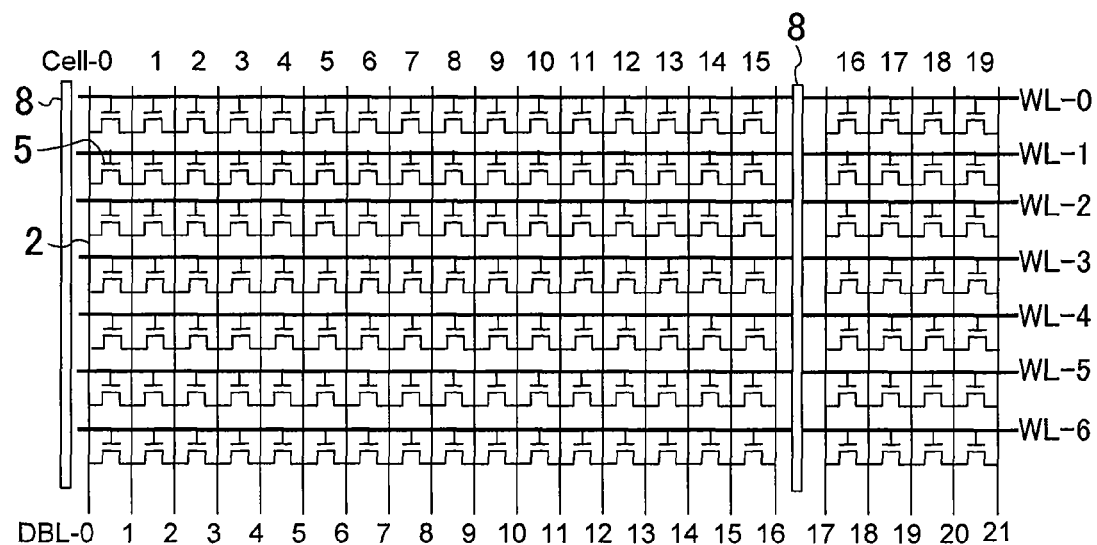
FIG. 30 is an enlarged view of a memory cell array portion in the circuit diagram of the memory array.

FIG. 1 is a circuit diagram of a memory array according to the present embodiment. Note that since memory cells of the present embodiment have the same cross-sectional structure as that described above with reference to FIG. 29, description thereof will not be repeated.

Figure 28:
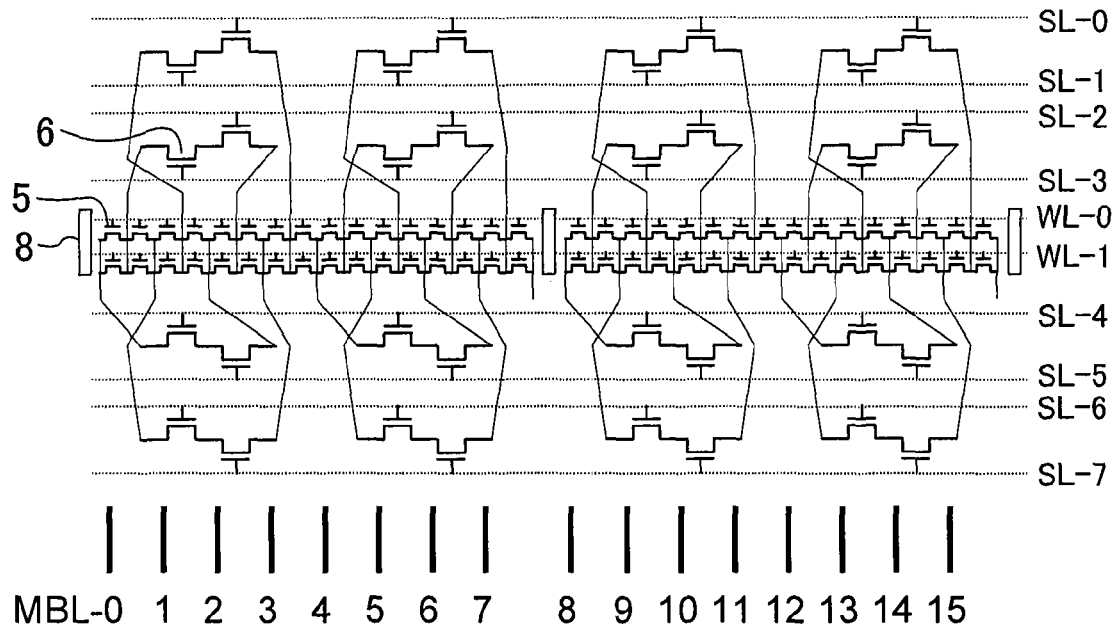
FIG. 28 is a memory array circuit diagram of the virtual ground array divided within the memory cell array.

As shown in FIG. 1, a basic structure of the memory array of the present embodiment is different from the structure of FIG. 28 only in that a selection word line (SL-8) is provided in addition to the selection word lines (SL-0 to SL-7), selection transistors 6 connected to the selection word line (SL-8) is provided, and each of the additional selection transistors 6 has its source connected to the bit line diffusion layer 2 on the right side of the corresponding sixteenth memory cell 5 from the left separated by the element isolation region 8. The structure of the memory array of the present embodiment is otherwise the same as the structure of FIG. 28. In the present embodiment, the selection word line (SL-8) is provided and one selection transistor 6 connected to the selection word line (SL-8) is additionally provided in Y direction (the up-down direction in the figure: a column direction) for every memory cell group of sixteen memory cells (that is, one selection transistor is added to the eight selection transistors in the conventional example). The potential of all the bit line diffusion layers 2 required for operation can thus be controlled.

In the present embodiment, description is given to the case where the memory element of the semiconductor memory device is an MONOS memory element. However, the present invention is not limited to this. The memory element of the semiconductor memory device may be a floating gate electrode-type memory element having the same array structure or a nanocrystal memory element including fine single-crystal silicon particles in a silicon oxide film.

Figure 16:
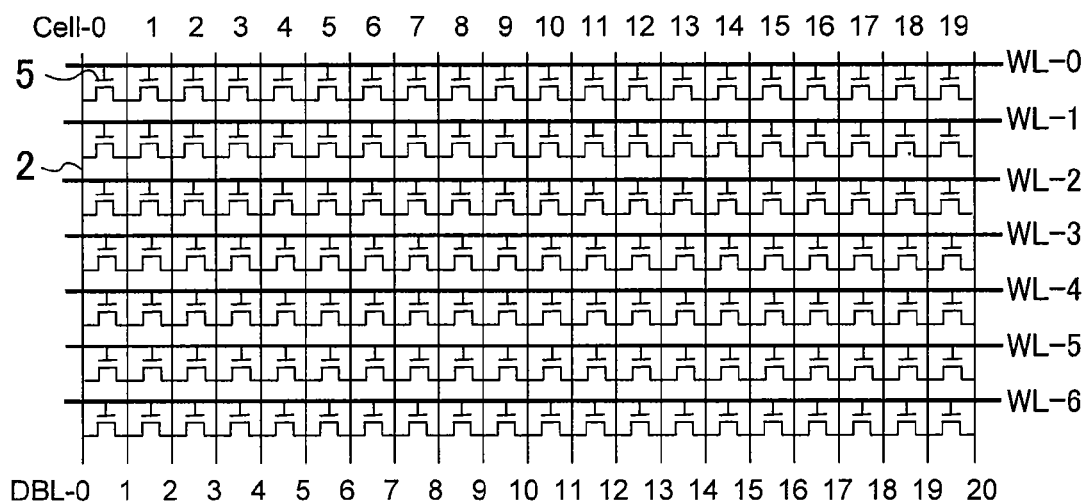
FIG. 16 is an enlarged view of a memory cell array portion.
Figure 17:
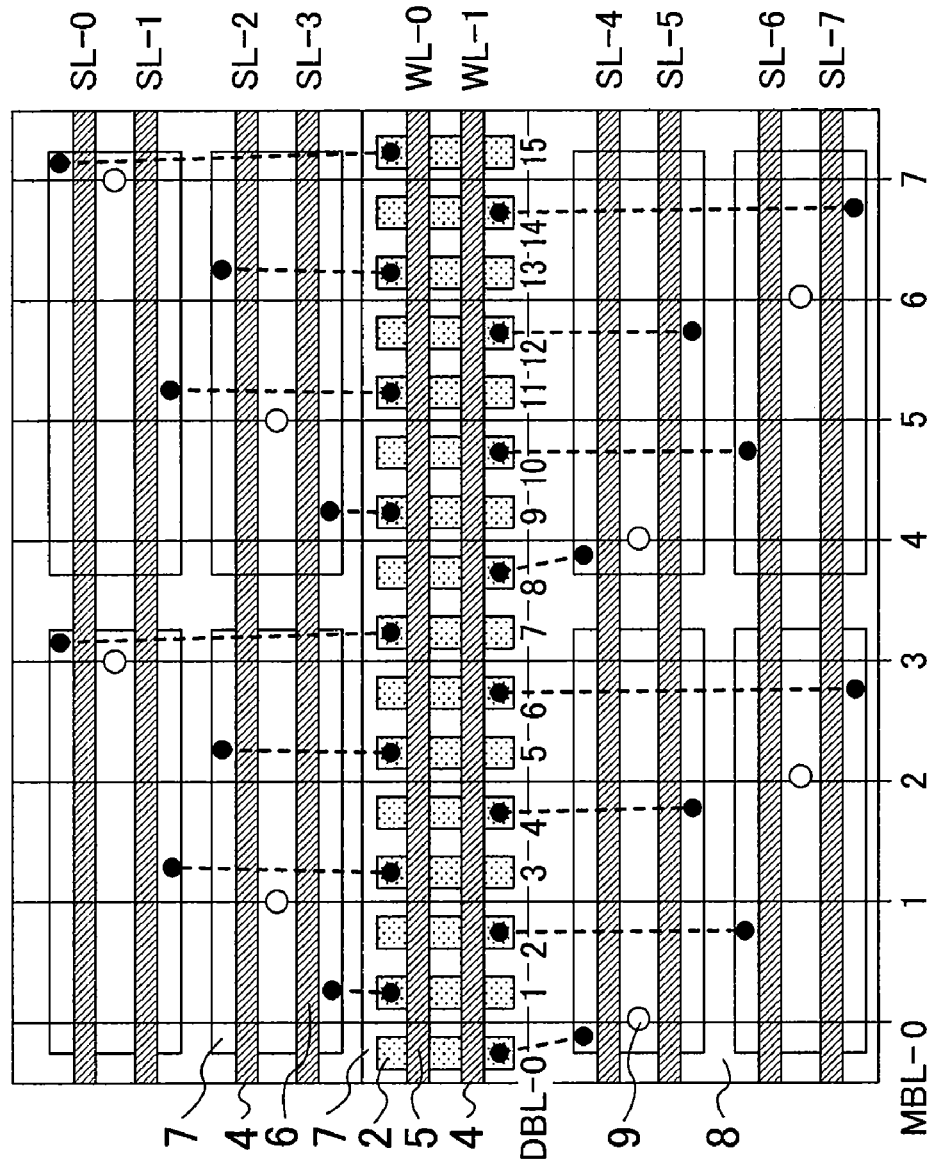
FIG. 17 shows a planar layout corresponding to the circuit diagram of the memory array.
Figure 18:
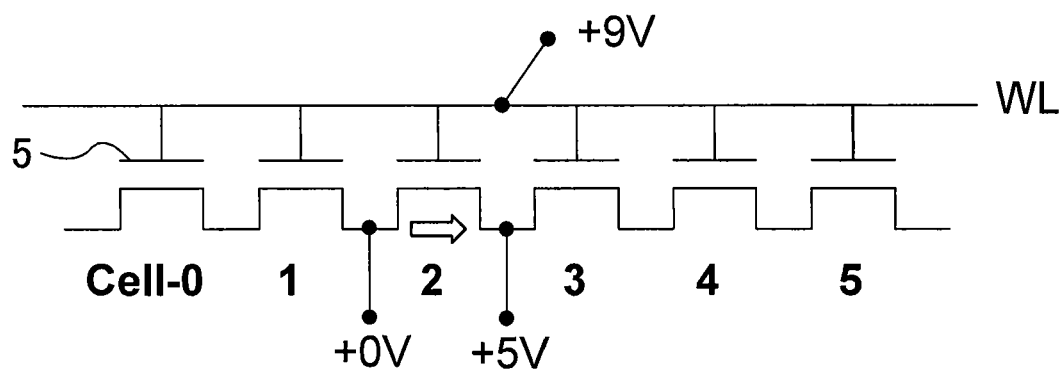
FIG. 18 is a circuit diagram of write operation.
Figure 19:
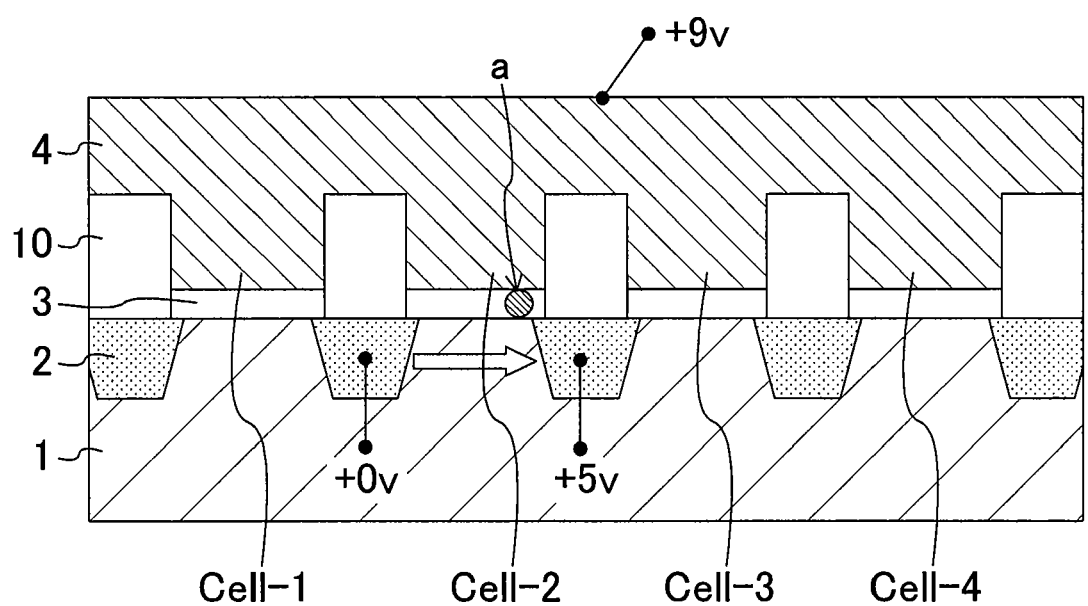
FIG. 19 is a cross-sectional view of memory cells in write operation.
Figure 20:
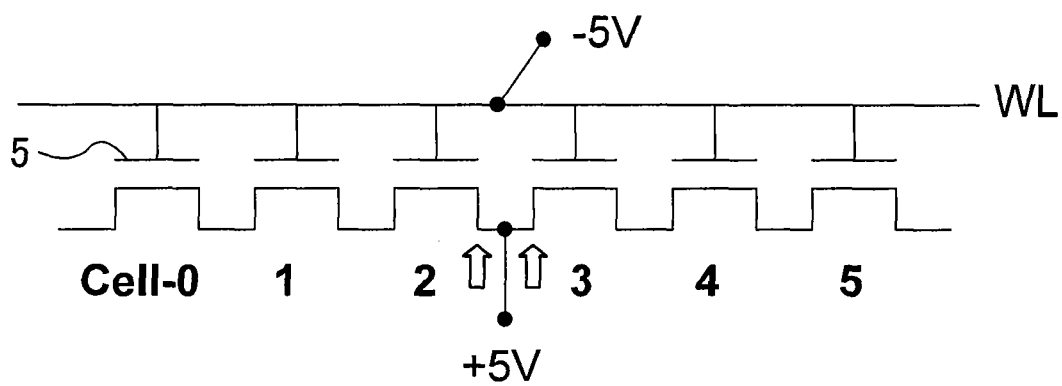
FIG. 20 is a circuit diagram of erase operation.
Figure 21:
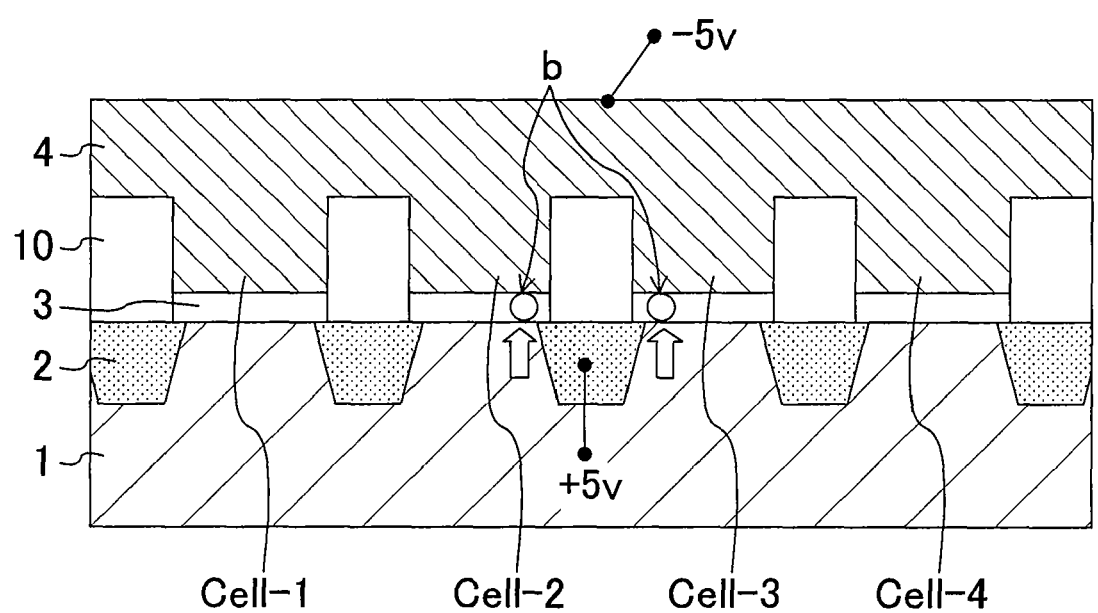
FIG. 21 is a cross-sectional view of memory cells in erase operation.
Figure 22:
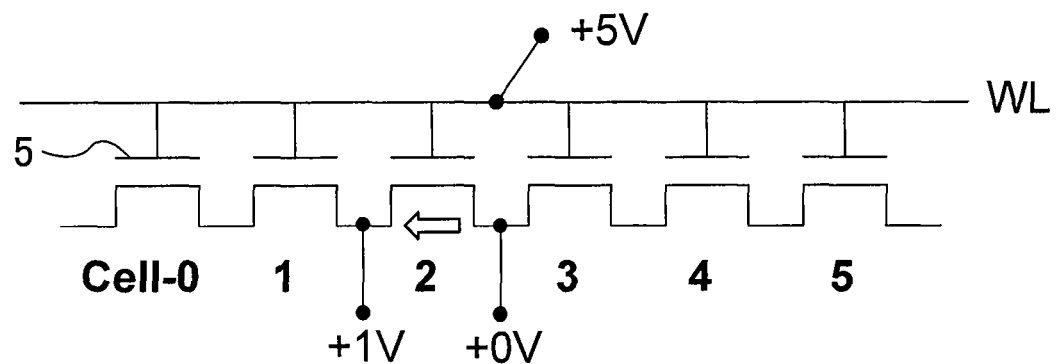
FIG. 22 is a circuit diagram of read operation.
Figure 23:
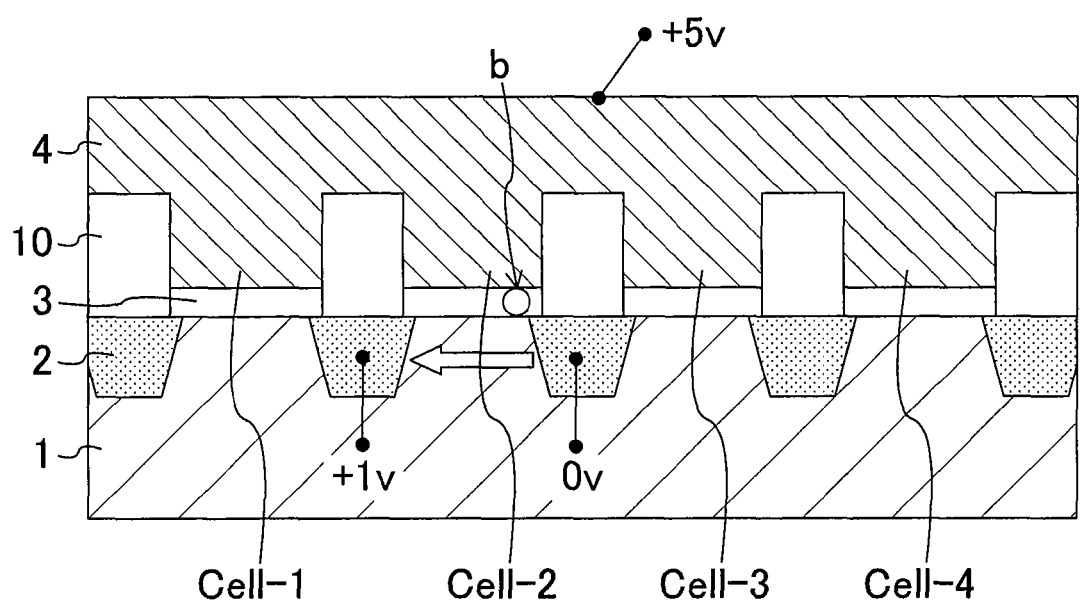
FIG. 23 is a cross-sectional view of memory cells in read operation.
Figure 24:
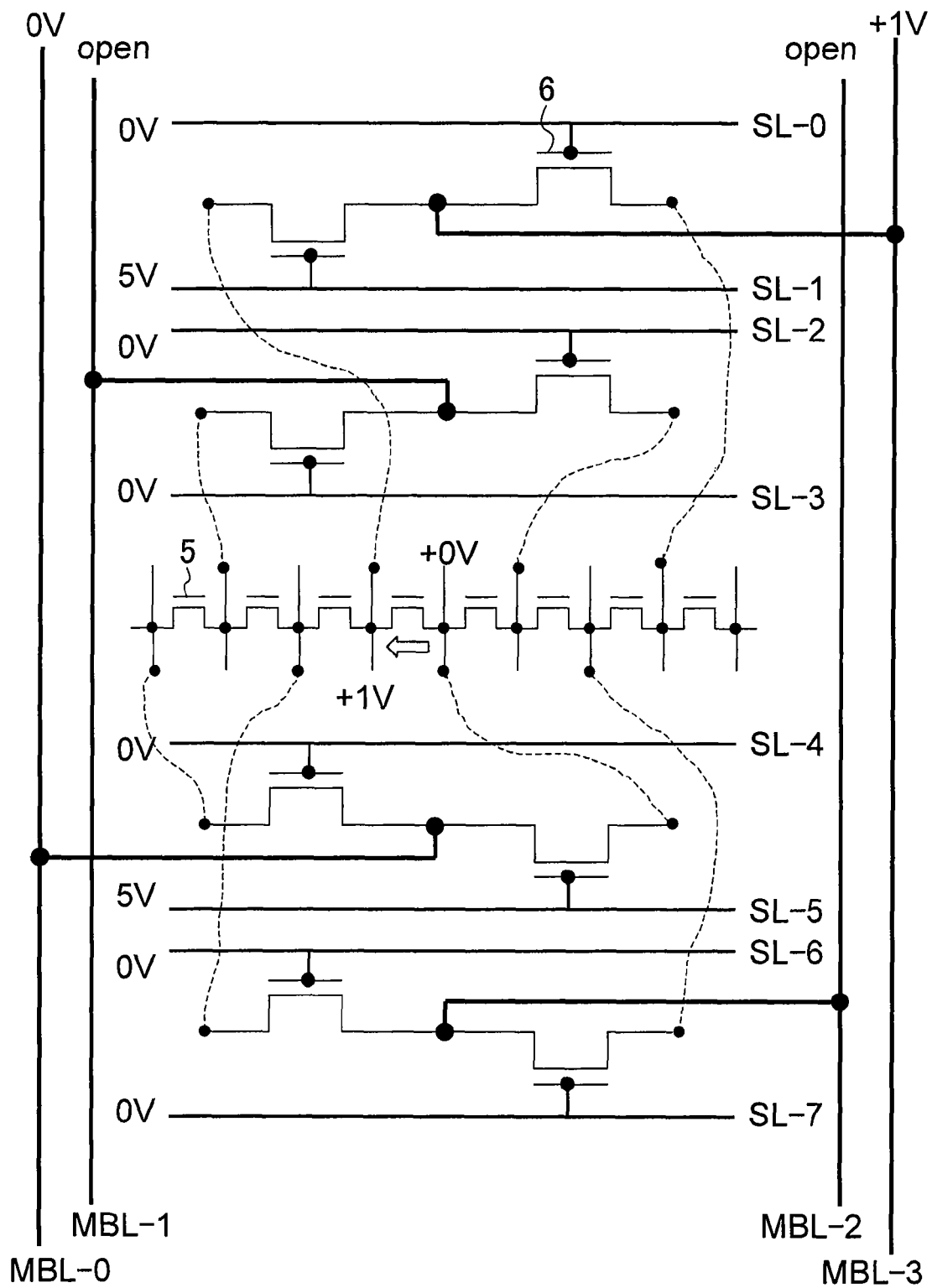
FIG. 24 is a circuit operation diagram illustrating a read state.
Figure 25:
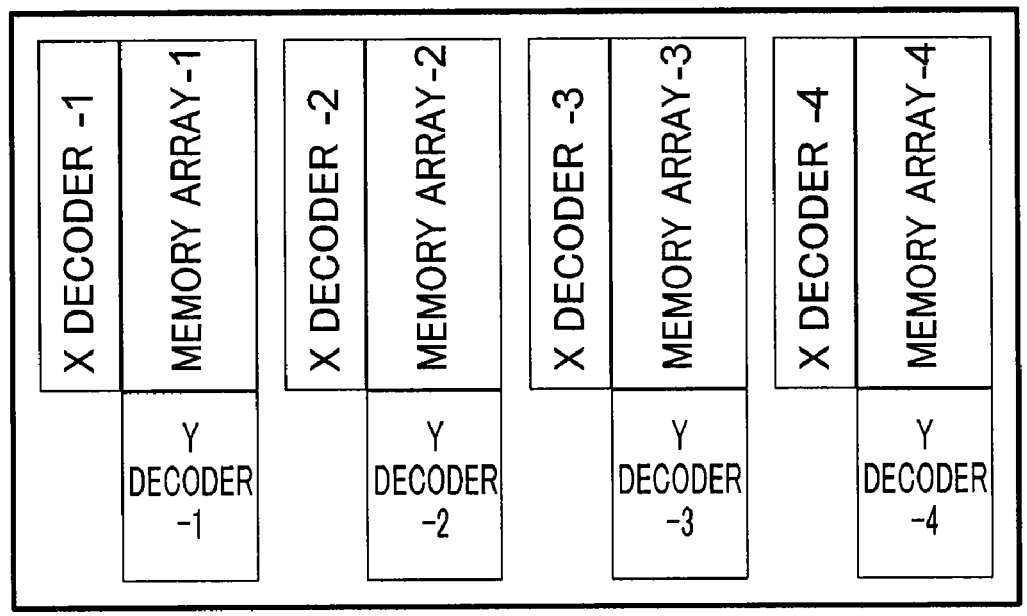
FIG. 25 schematically shows a chip layout obtained by dividing a virtual ground array into rewrite units by using an X decoder (a decoder for driving memory word lines)
Figure 26:
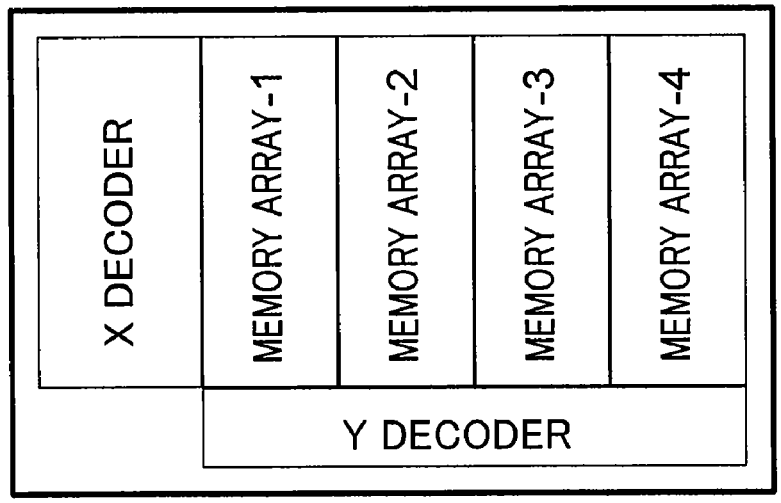
FIG. 26 schematically shows a chip layout obtained by dividing a virtual ground array into rewrite units within a memory cell array.
Figure 27:
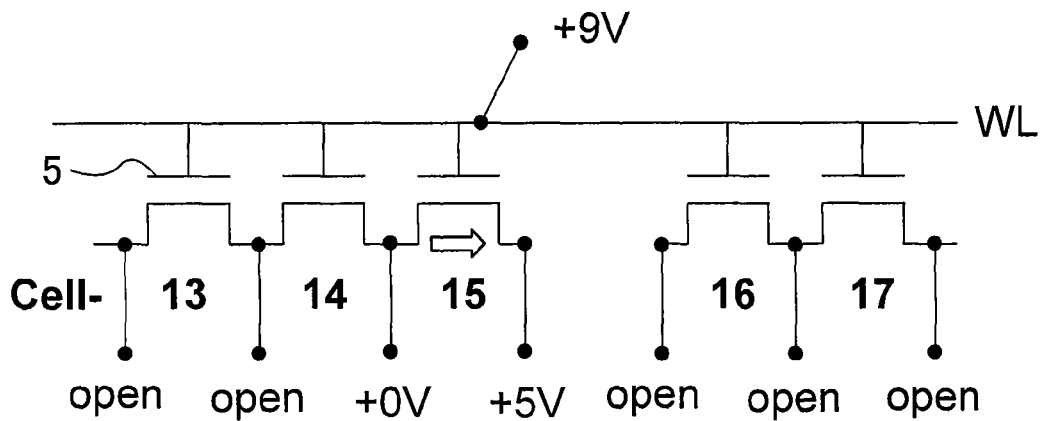
FIG. 27 is a circuit diagram of write operation in the virtual ground array divided within the memory cell array.

An enlarged structure of the array portion of the memory cells 5 in FIG. 1 is the same as that described above with reference to FIG. 16. As shown in FIG. 16, the gate electrode of each memory cell 5 is connected to a corresponding one of memory word lines (WL0 to WL6) extending in X direction (the left-right direction in the figure: a row direction), and the bit line diffusion layers 2 serving as the sources and drains of the memory cells 5 extend in Y direction to form diffusion layer bit lines (DBL-0 to DBL-21). An element isolation region 8 is provided in X direction for every memory cell group of 16 memory cells 5, and seven memory cells 5 are arranged in Y direction. This structure is arranged in a matrix pattern to form an array.

Figure 2:
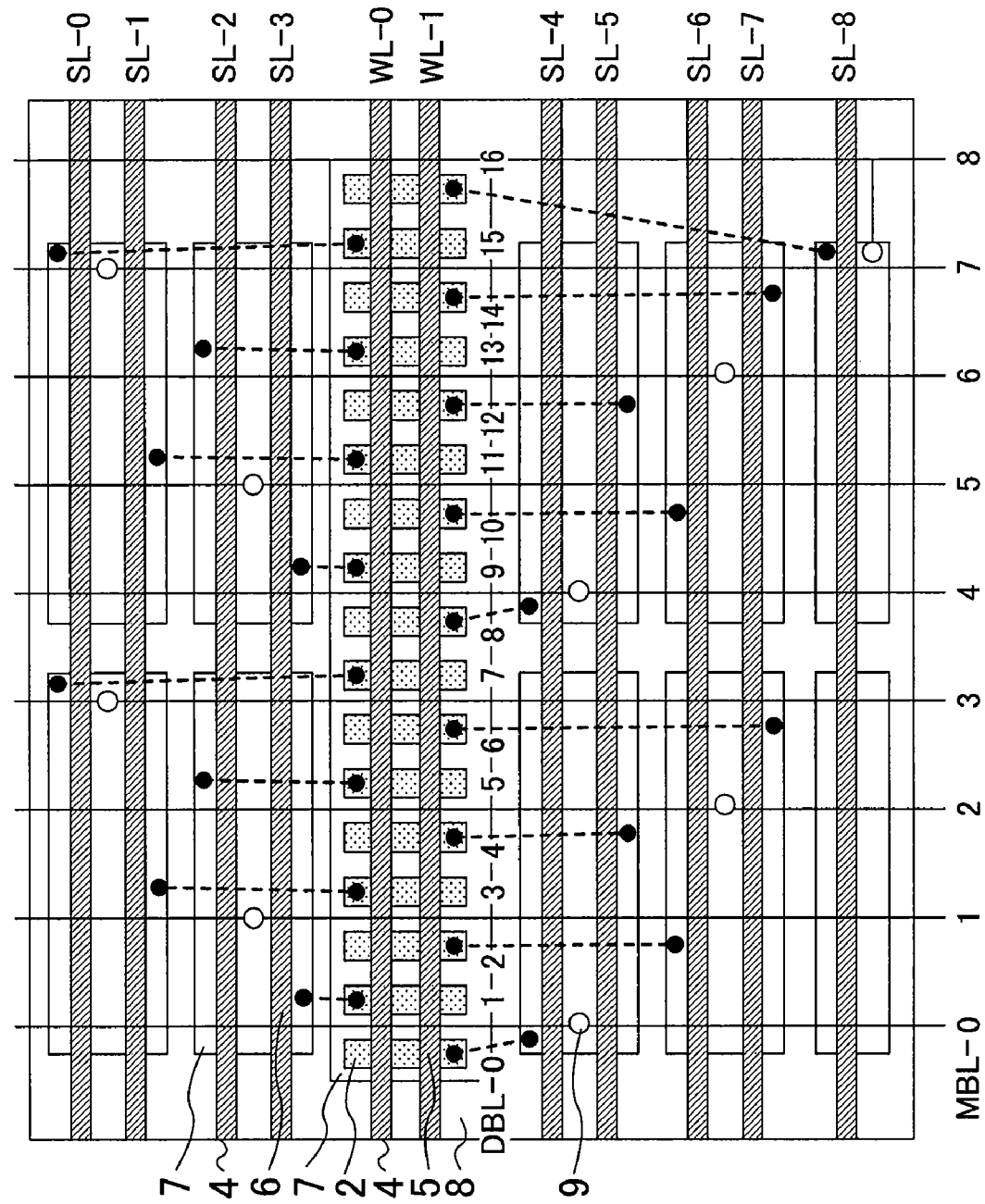
FIG. 2 shows a planar layout corresponding to the circuit diagram of the memory array according to the first embodiment of the present invention.

FIG. 2 shows a planar layout corresponding to the circuit diagram of the memory array of FIG. 1. Note that FIG. 2 shows a half of the structure in the left-right direction in FIG. 1. In other words, FIG. 2 shows a region corresponding to the selection word lines (SL-0 to SL-8) and the main bit lines (MBL-0 to MBL-8).

As shown in FIG. 2, memory cells 5 formed by an active region (thin film region) 7, bit line diffusion layers 2, and a gate electrode 4 are arranged in X direction in a central region of the up-down direction in the figure so that the memory cells 5 are surrounded by the element isolation region 8. The selection transistors 6 formed by the active region 7 and the gate electrode 4 are provided above and below the memory cells 5. Each main bit line (MBL-0 to MBL-8) is connected to the active region 7 (drain) common to two selection transistors 6 through an MBL contact 9. Note that, in FIG. 2, only one selection transistor 6 located at the lower right end of the figure is connected to the selection word line (SL-8) that is actually used. However, in order to match the capacity applied to the selection word line (SL-8) with that applied to the other selection word lines (SL-0 to SL-7), two selection transistors 6 may be actually provided for the selection word line (SL-8) like the selection transistors 6 connected to the other selection word lines (SL-0 to SL-7).

As has been described above, in the semiconductor memory device of the present embodiment, the bit line diffusion layers 2 located on both sides of the element isolation region 8 are connected to the independent selection transistors 6. Therefore, unlike the conventional structure in which the virtual ground array is divided into the rewrite units within the memory cell array, the semiconductor memory device of the present embodiment can be driven without causing wrong writing, wrong erasure, and wrong reading.

Moreover, as compared to the conventional structure having an X decoder and a Y decoder for each rewrite unit, the structure of the present embodiment has a factor that increases the area because the element isolation regions 8 are added and the selection transistors 6 are added in the longitudinal direction. However, since reduction in area achieved by sharing the X decoder and the Y decoder is much more than the increase in area, increase in area can be significantly reduced after all.

Note that, in FIG. 1, nine selection word lines (SL-0 to SL-8) are provided for every sixteen memory cells 5 arranged in X direction, and a total of seventeen selection transistors 6 are provided for the nine selection word lines. However, the arrangement method thereof and the connection method between the sources of the selection transistors 6 and the bit line diffusion layers 2 of the memory cells 5 are not limited to those shown in the figures, but another arrangement method and another connection method may be used.

In the example shown in FIG. 1, sixteen memory cells 5 are arranged in X direction between the element isolation regions 8. However, the present invention is not limited to this, and a memory cell group consisting of an integral multiple of eight memory cells 5 that are actually used as a storage region can be provided between the element isolation regions 8. For example, a memory cell group consisting of eight memory cells 5 or a memory cell group consisting of 32 memory cells 5 may be provided in X direction between the element isolation regions 8. A dummy memory cell 5 that is not actually used as a storage region may further be provided as a memory element in the memory cell group consisting of eight memory cells 5. In this case, the number of selection transistors 6 may be increased from 17 so that the bit line diffusion layer 2 connected to the dummy memory cell 5 can be driven. In this case, the number of selection word lines may be increased from 9 to 10.

For example, in the case where eight memory cells 5 are provided in X direction between the element isolation regions 8, nine selection word lines (SL-0 to SL-8) are provided for the eight memory cells 5 arranged in X direction, and a total of nine selection transistors 6 are provided for the nine selection word lines. In the case where 32 memory cells 5 are provided in X direction between the element isolation regions 8, nine selection word lines (SL-0 to SL-8) are provided for the 32 memory cells 5 arranged in X direction, and a total of 33 selection transistors 6 are provided for the nine selection word lines.

Variations of the first embodiment will be specifically described below as first and second modifications.

(First Modification)

Figure 3:
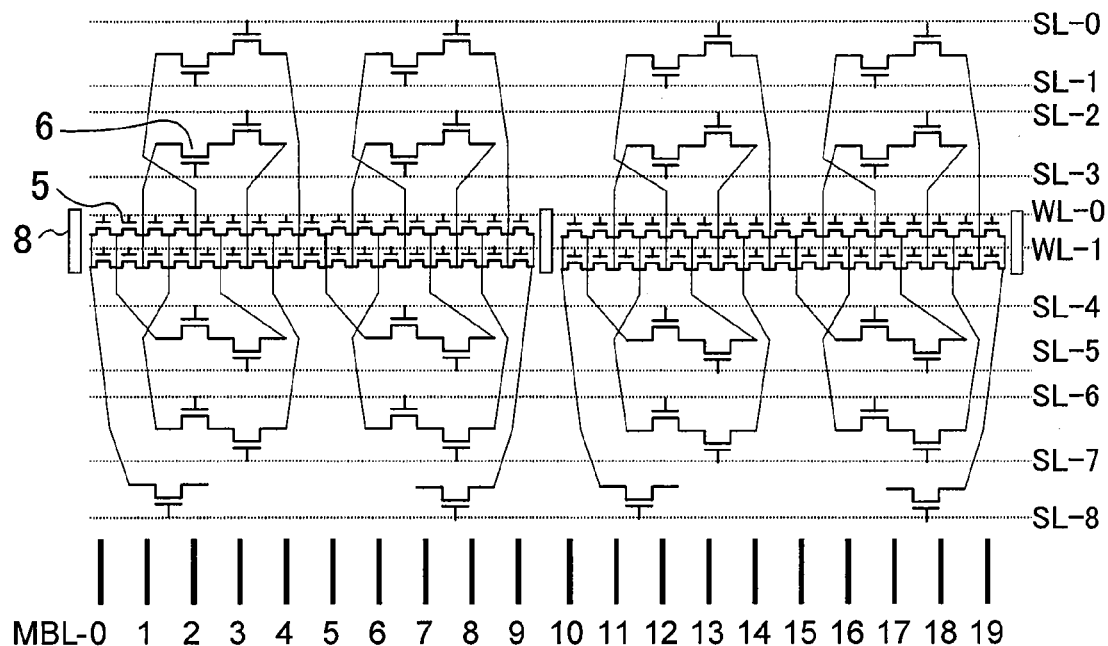
FIG. 3 is a circuit diagram of a memory array according to a first modification of the first embodiment.
Figure 4:
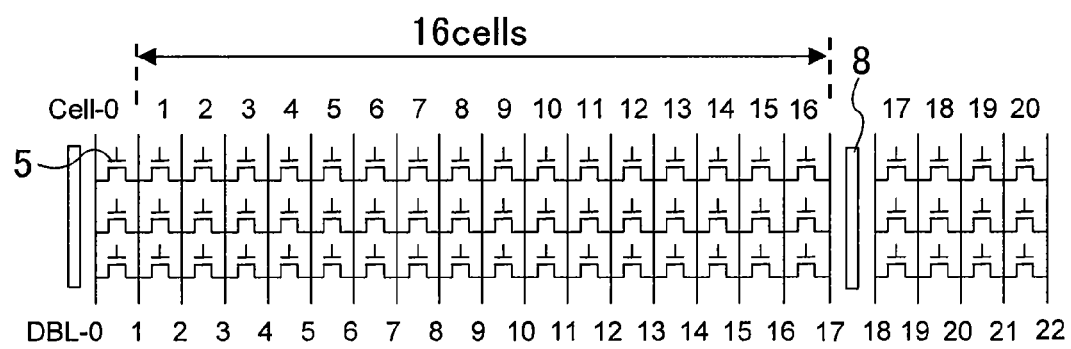
FIG. 4 shows an enlarged structure of a memory cell array portion according to the first modification of the first embodiment.
Figure 5:
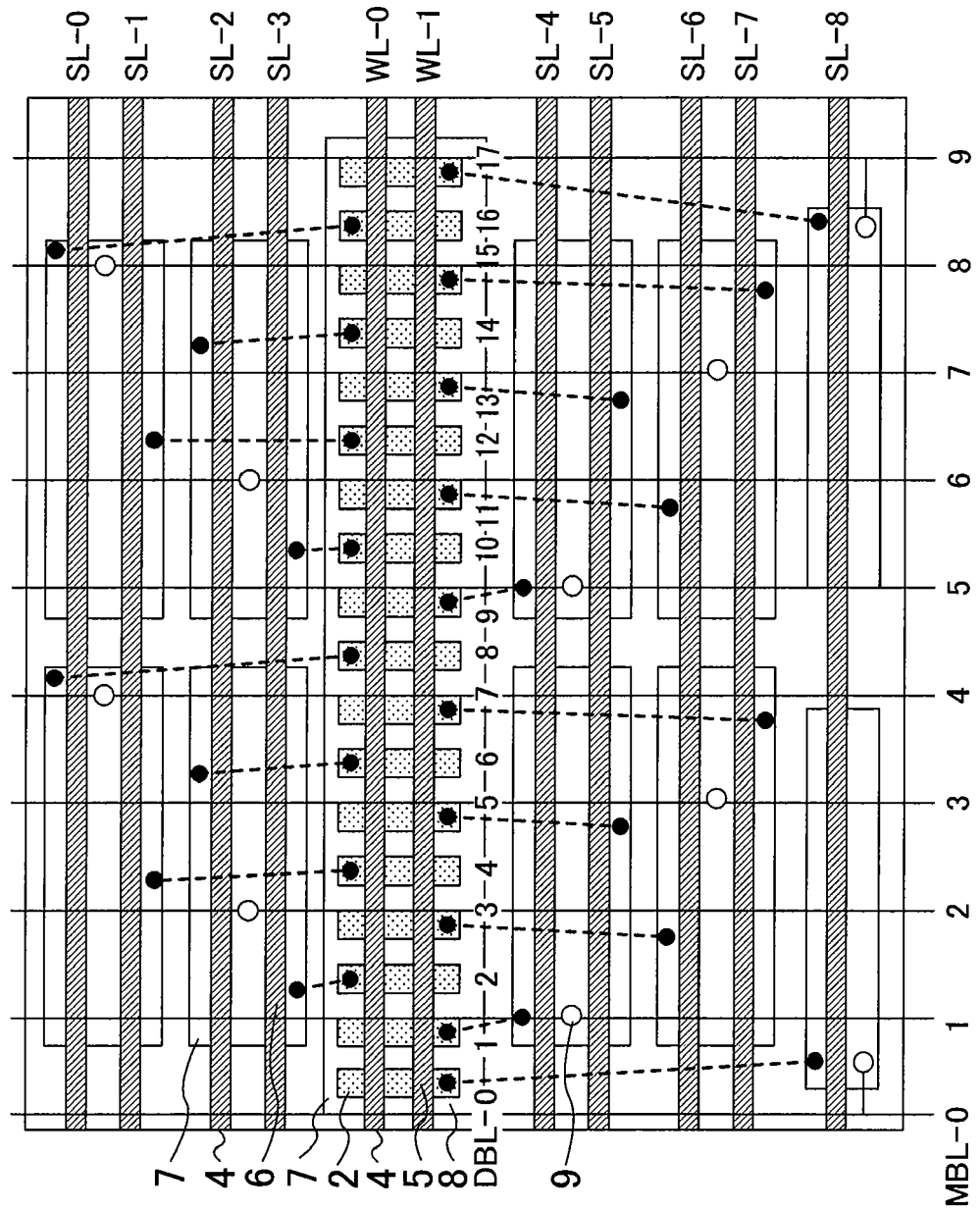
FIG. 5 shows a planar layout corresponding to the circuit diagram of the memory array according to the first modification of the first embodiment.

FIGS. 3 through 5 are diagrams illustrating a first modification of the first embodiment. FIG. 3 is a circuit diagram of a memory array of the first modification, FIG. 4 shows an enlarged structure of an array portion of the memory cells 5 shown in FIG. 3, and FIG. 5 shows a planar layout corresponding to the circuit diagram of the memory array of FIG. 3.

As shown in FIGS. 3 through 5, in the first modification, nine selection word lines (SL-0 to SL-8) are provided, and 18 selection transistors 6 and 17 memory cells 5 including one dummy cell are provided between the element isolation regions 8. Each memory cell 5 is interposed between bit line diffusion layers 2 that can be driven by the corresponding selection transistors 6.

As described above, in the first modification, one selection transistor and one dummy cell are added to the structure of FIG. 1.

(Second Modification)

Figure 6:
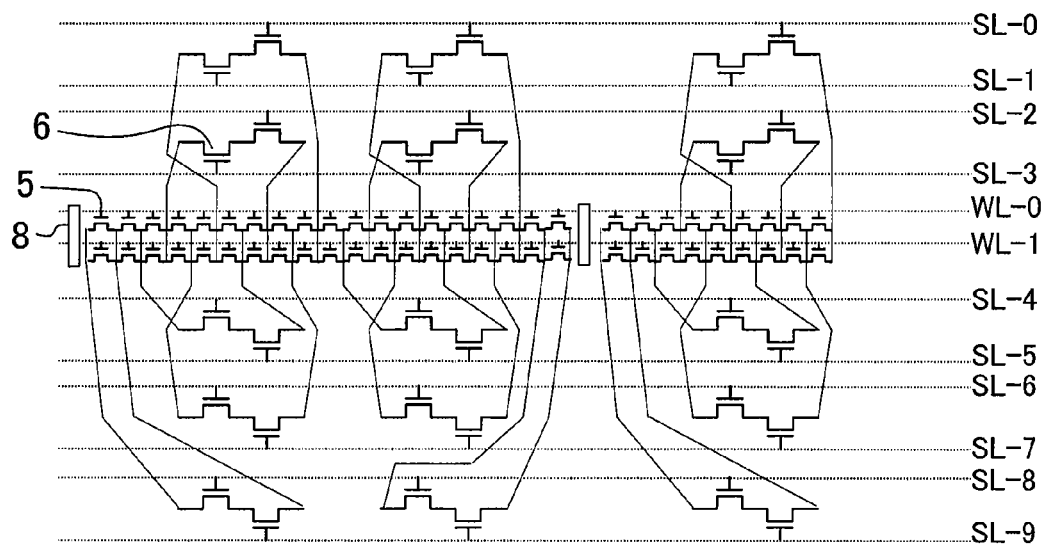
FIG. 6 is a circuit diagram of a memory array according to a second modification of the first embodiment.
Figure 7:
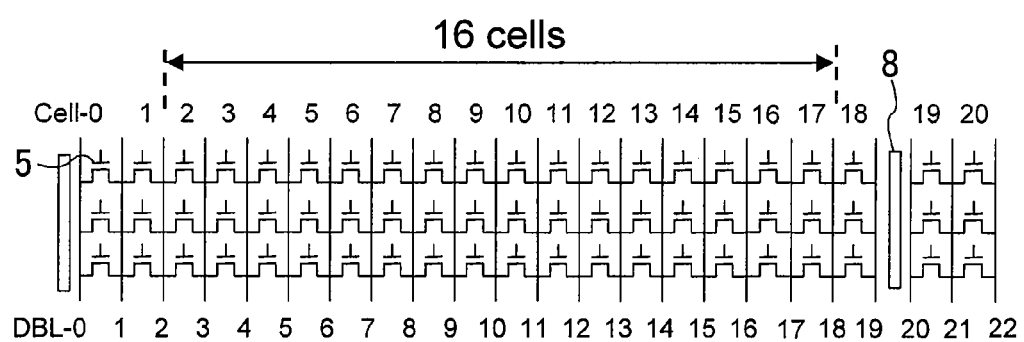
FIG. 7 shows an enlarged structure of a memory cell array portion according to the second modification of the first embodiment.

FIGS. 6 and 7 are diagrams illustrating a second modification of the first embodiment. FIG. 6 is a circuit diagram of the memory array of the second modification and FIG. 7 shows an enlarged structure of an array portion of the memory cells 5 shown in FIG. 6.

As shown in FIGS. 6 and 7, in the second modification, ten selection word lines (SL-0 to SL-9) are provided, and 20 selection transistors 6 and 19 memory cells 5 including three dummy cells are provided between the element isolation regions 8. Each memory cell 5 is interposed between bit line diffusion layers 2 that can be driven by the corresponding selection transistors 6.

As described above, in the second modification, one selection word line, three selection transistors, and three dummy cells are added to the structure of FIG. 1.

[How to Count the Number of Memory Cells]

Figure 8:
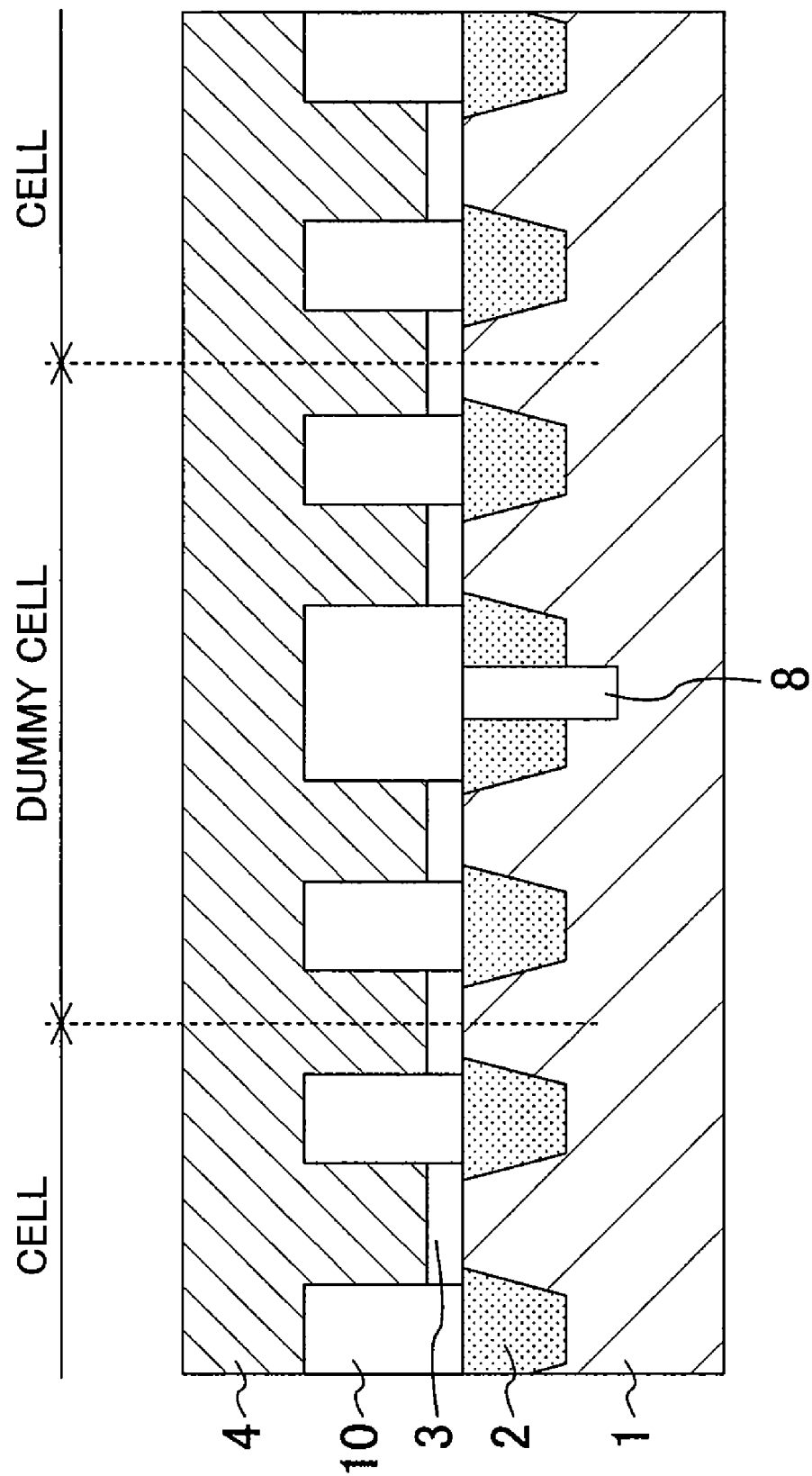
FIG. 8 shows a cross-sectional structure of local trap MONOS memory cells according to the first embodiment of the present invention, in which a dummy cell is provided in a region where a memory element repetition pattern is changed by an element isolation region.

FIG. 8 shows a cross-sectional structure of local trap MONOS memory cells. In FIG. 8, a dummy cell is provided in a region where a memory element repetition pattern is changed by the element isolation region 8.

Figure 9:
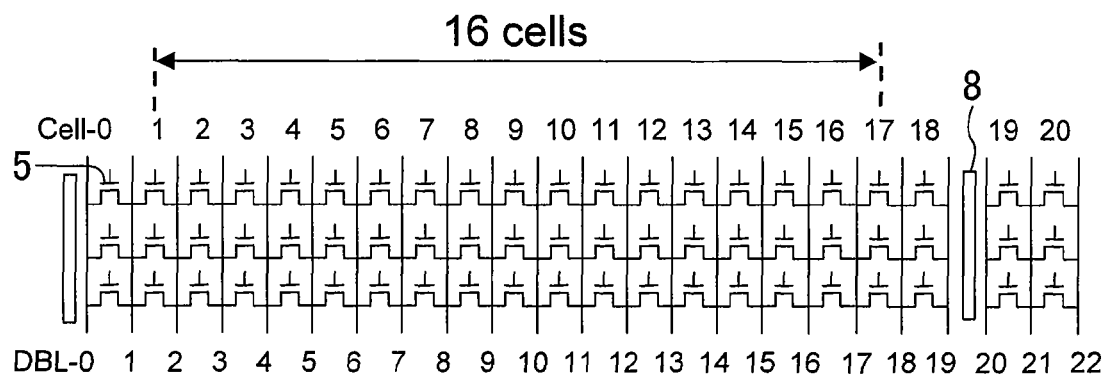
FIG. 9 shows an enlarged structure of a memory cell array portion according to the first embodiment of the present invention.

In the local trap MONOS memory cell having the structure of FIG. 8, as described above with reference to FIGS. 18 through 26, the storage state can be controlled independently on each side of the charge trap film 3 of the memory cell 5. Therefore, as shown in FIG. 8, it is also possible to use only one side of the charge trap film 3 of the memory cell 5. In this case, as shown in the enlarged structure of an array portion of the memory cells 5 in FIG. 9, 16 memory cells 5 located in the middle of the 19 memory cells 5 between the element isolation regions 8 are actually used as a storage region. Providing 19 memory cells 5 between the element isolation regions 8 can implement the structure having 1.5 dummy cells on both sides, whereby a balanced operation can be achieved.

Note that, in the local trap MONOS memory, two kinds of information can be stored in each memory cell 5. Especially in the memory cells 5 located at the ends of the memory cells 5 to be used as a storage region, information may be stored at either both ends or one end of the charge trap film 3 interposed between the bit line diffusion layers 2. Therefore, in the present invention, a region from the center of a bit line diffusion layer 2 to the center of an adjacent bit line diffusion layer 2 may be counted as one memory cell 5. Alternatively, a region from the center of the charge trap film 3 located under a gate electrode 4 to the center of the charge trap film 3 located under an adjacent gate electrode 4 may be counted as one memory cell 5.

Note that, in the local trap MONOS memory, as described above with reference to FIG. 1 and the like, a memory cell array is formed by using eight selection transistors 6 as a unit. The memory cell array is therefore divided by the element isolation regions 8 by using (8×N) memory cells 5 arranged in a row direction as a base unit (where N is a natural number). Note that the number of memory cells 5 can be counted in two ways as described above.

The number of memory cells 5 that are actually used as a storage region is (8×N) as described above. A plurality of dummy cells that are not actually used as a storage region may be provided at both ends of the (8×N) memory cells 5. These dummy cells are provided in order to assure processing stability and to assure symmetry of characteristics between the memory cells 5 located in the middle and the memory cells 5 located at the ends.

At least one selection word line (SL-8) is provided in Y direction in addition to the eight selection word lines (SL-0 to SL-7) required to drive a base unit of selection transistors 6 (eight selection transistors 6). One or two selection word lines (SL-8, SL-9) are added to the eight selection word lines (SL-0 to SL-7) in the first embodiment and the modifications thereof described above. Although the number of selection word lines, L, can be at least 9, the structure having L=9 or 10 is practical. Note that, in the present embodiment and the modifications thereof, whether the structure having L=9 or L=10 is used is determined depending on the number of dummy cells to be driven.

For each group of (8×N) memory cells 5 arranged in the row direction and separated by the element isolation region 8 (where N is a natural number), one to N selection transistors 6 are connected to each selection word line. In the first embodiment and the modifications thereof, the number of actually functioning selection transistors 6 is (8×N+1) to (L×N).

Since two selection transistors share a main bit line, the number of main bit lines is ((8×N+1)/2) to ((L×N)/2). Since the number of main bit lines is a natural number, ((8×N+1)/2) can be represented as (4×N+1).

Second Embodiment

Hereinafter, a semiconductor memory device and a driving method thereof according to a second embodiment of the present invention will be described with reference to the figures.

Figure 10:
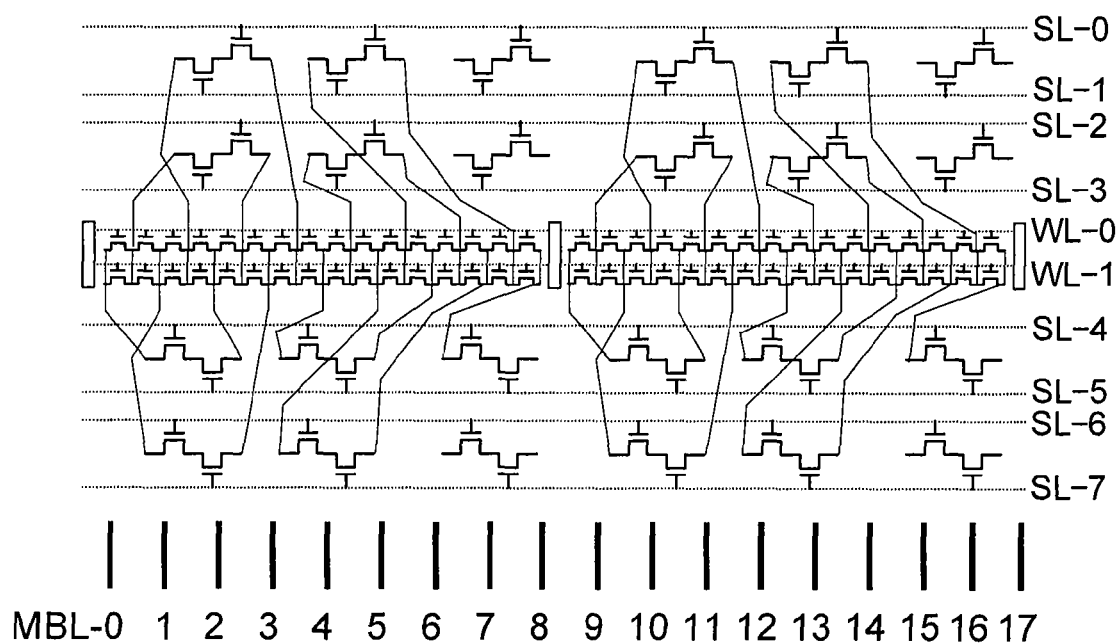
FIG. 10 is a circuit diagram of a memory array according to a second embodiment of the present invention.

FIG. 10 is a circuit diagram of a memory array of the second embodiment. Note that since the cross-sectional structure of the memory cells of the second embodiment is the same as that described above with reference to FIG. 29, description thereof will not be repeated.

As shown in FIG. 10, the memory cell array structure of the second embodiment is different from that of FIG. 28 described above only in that an additional selection transistor 6 is connected to the existing selection word line (SL-4), and the source of this selection transistor 6 is connected to the bit line diffusion layer 2 located on the right side of the sixteenth memory cell 5 from the left separated by the element isolation region 8. The memory cell array structure of the second embodiment is otherwise the same as that of FIG. 28. By adding one selection transistor 6 to the existing selection word line SL-4 extending in X direction (the left-right direction in the figure: row direction), bit line diffusion layers 2 located on both sides of the element isolation region 8 are connected to independent selection transistors 6. As a result, the memory array can be driven without causing wrong selection, wrong writing, and wrong erasure.

The size of the memory cell array is not increased by adding the selection transistor 6. However, it should be noted that the size (transistor width) of the selection transistors 6 is reduced and the current driving capability may be reduced.

Figure 11:
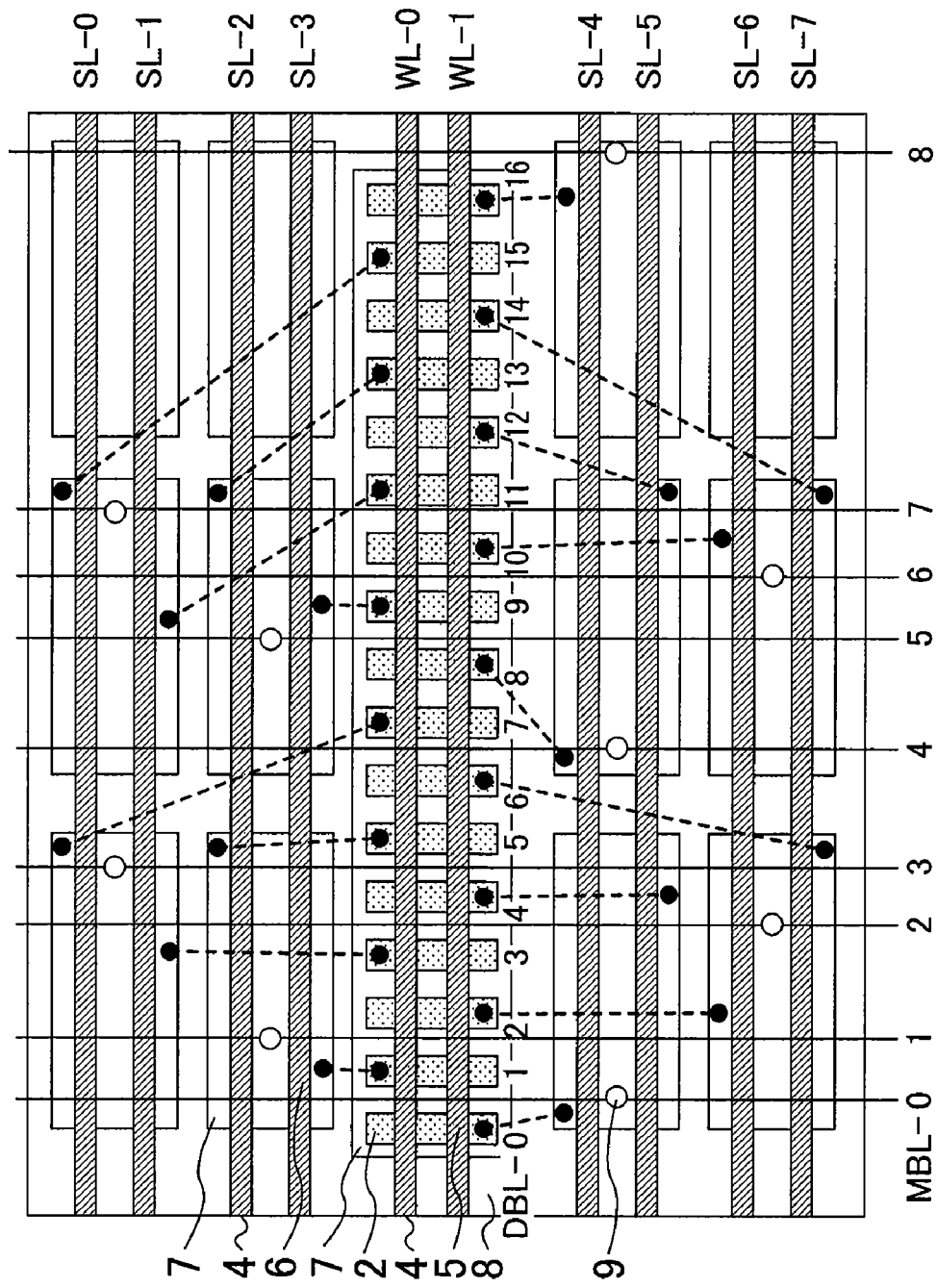
FIG. 11 is a planar layout corresponding to the circuit diagram of the memory cell array according to the second embodiment of the present invention.

FIG. 11 shows a planar layout corresponding to the circuit diagram of the memory cell array of FIG. 10. Note that FIG. 11 shows a half of the structure in the left-right direction in FIG. 10. In other words, FIG. 11 shows a region corresponding to selection word lines (SL-0 to SL-7) and main bit lines (MBL-0 to MBL-8).

As shown in FIG. 11, memory cells 5 formed by an active region (thin film region) 7, bit line diffusion layers 2, and a gate electrode 4 are arranged in the left-right direction of the figure in a central region of the up-down direction (Y direction) in the figure so that the memory cells 5 are surrounded by the element isolation region 8. The selection transistors 6 formed by the active region 7 and the gate electrode 4 are provided above and below the memory cells 5. Each main bit line (MBL-0 to MBL-7) is connected to the active region 7 (drain) common to two selection transistors 6 through an MBL contact 9. Note that, in FIG. 11, the seventeenth selection transistor 6 that is actually used is the one located at the right end in the figure and connected to the selection word line (SL-4). In view of the balance of the current driving capability with other selection transistors and in order to match the respective capacities applied to the selection word lines (SL-1 to SL-7) with each other, dummy selection transistors 6 are provided above and below the selection word line (SL-4).

(Modification)

Figure 12:
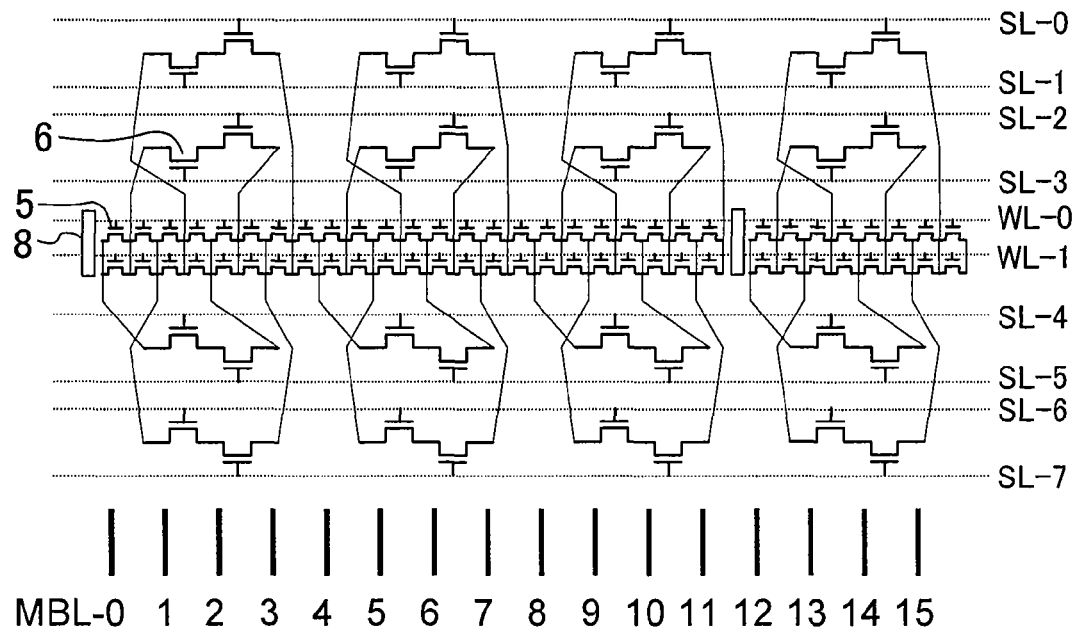
FIG. 12 is a circuit diagram of a memory array according to a modification of the second embodiment.
Figure 13:
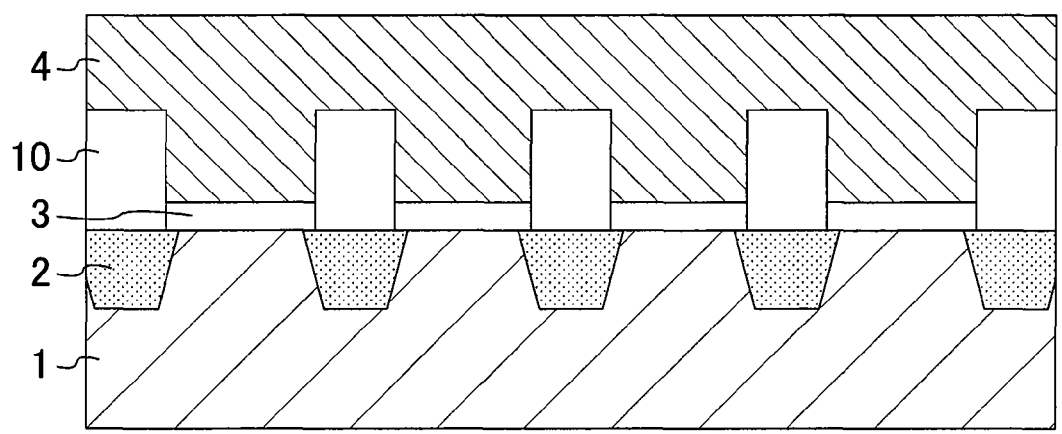
FIG. 13 is a cross-sectional view of a MONOS memory cell.
Figure 14:
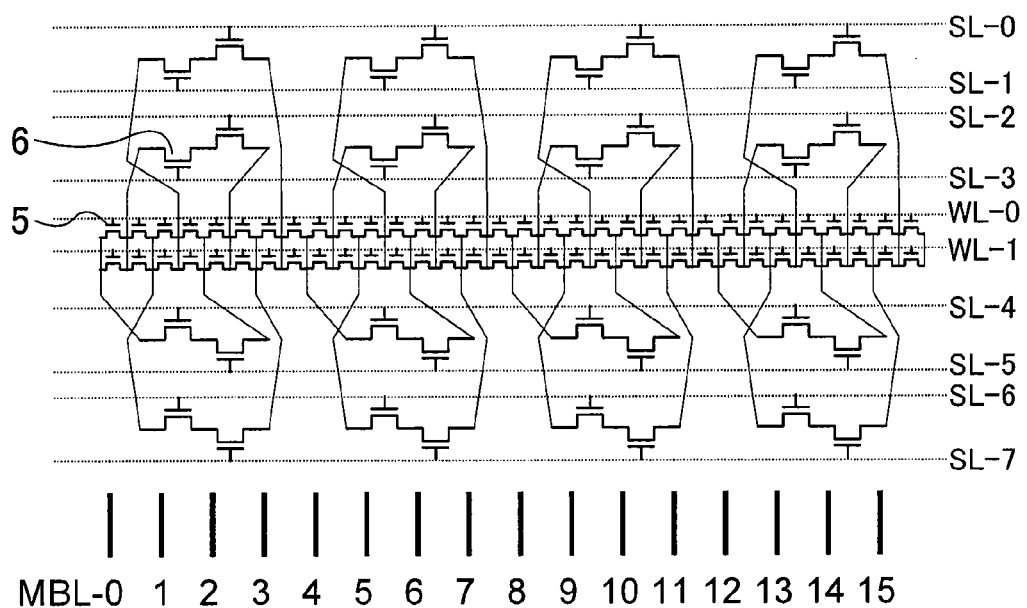
FIG. 14 is a circuit diagram of a memory array.
Figure 15:
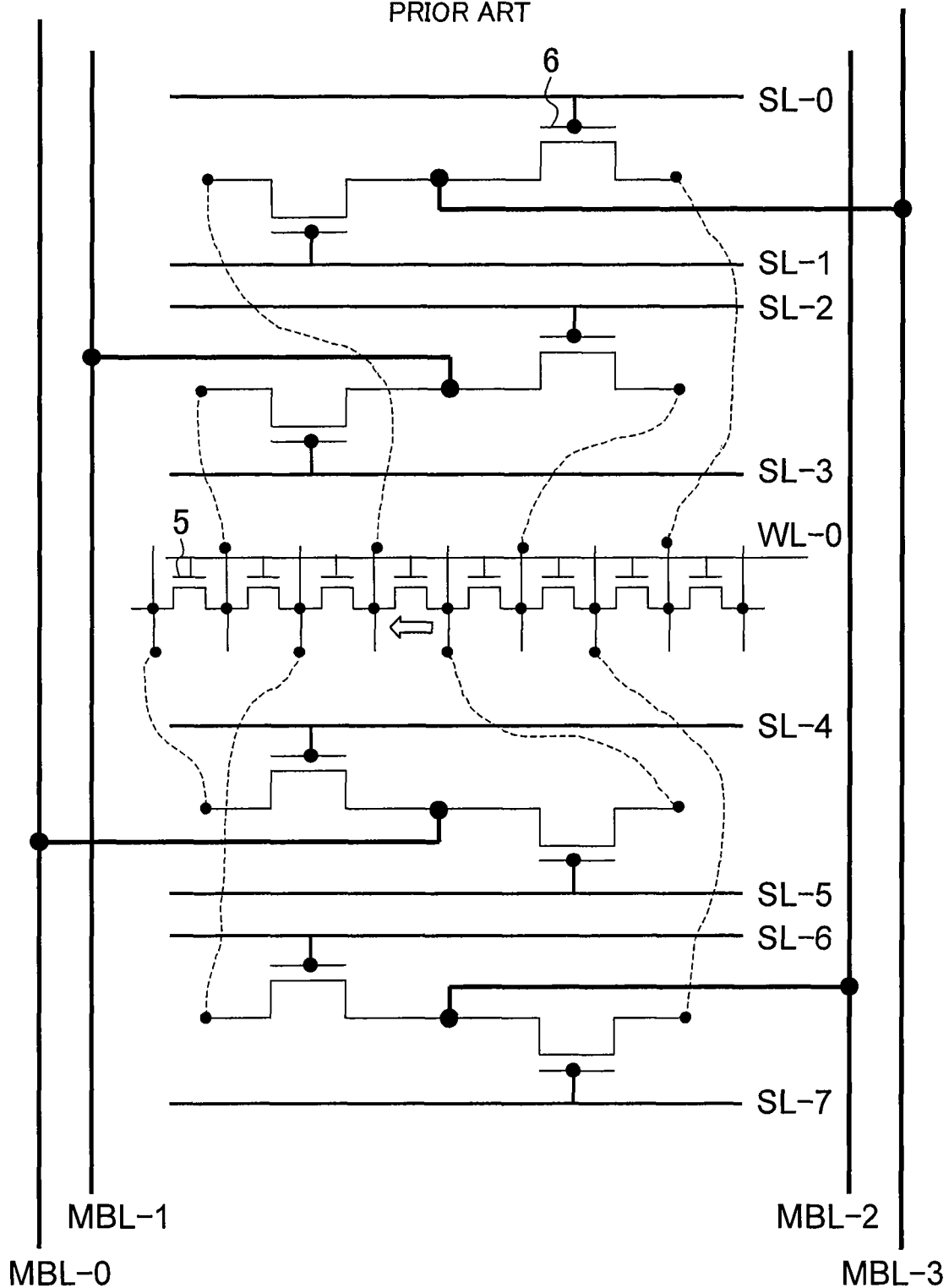
FIG. 15 is a partial enlarged view of the memory array, showing connection between main bit lines and selection transistors.

FIG. 12 is a circuit diagram of a memory array according to a modification of the second embodiment.

As shown in FIG. 12, in this modification, 24 selection transistors 6 are connected to bit line diffusion layers 2 so that memory cells in a region other than a storage region to be actually used as a storage region can be driven.

Since a voltage can be applied to dummy cells that are not actually used as a storage region, symmetry of characteristics between the memory cells 5 located in the middle in X direction and the memory cells 5 located at the ends is more likely to be assured.

As has been described above, in the semiconductor memory device of the second embodiment, the bit line diffusion layers 2 located on both sides of the element isolation region 8 are connected to the independent selection transistors 6. Therefore, unlike the conventional structure in which the virtual ground array is divided into the rewrite units within the memory cell array, the semiconductor memory device of the second embodiment can be driven without causing wrong writing, wrong erasure, and wrong reading.

Moreover, as compared to the conventional structure having an X decoder and a Y decoder for each rewrite unit, the structure of the second embodiment has a factor that increases the area because the element isolation regions 8 are added and the selection transistors 6 are added in the longitudinal direction. However, since reduction in area achieved by sharing the X decoder and the Y decoder is much more than the increase in area, increase in area can be significantly reduced after all.

Note that, in the local trap MONOS memory, as described above with reference to FIG. 1 and the like, a memory cell array is formed by using eight selection transistors 6 as a unit. The memory cell array is therefore divided by the element isolation regions 8 by using (8×N) memory cells 5 arranged in the row direction as a base unit (where N is a natural number).

Note that the number of memory cells 5 can be counted in two ways as described in the first embodiment.

The number of memory cells 5 that are actually used as a storage region is (8×N) as described above. A plurality of dummy cells that are not actually used as a storage region may be provided at both ends of the (8×N) memory cells 5. These dummy cells are provided in order to assure processing stability and to assure symmetry of characteristics between the memory cells 5 located in the middle and the memory cells 5 located at the ends.

Eight selection word lines (SL-0 to SL-7) required to drive a base unit of the selection transistors 6 (eight selection transistors 6) are provided.

For the total of (8×N) memory cells 5 arranged in the row direction and separated by the element isolation region 8 (where N is a natural number) and the number of dummy cells, N to (N+1) selection transistors 6 including a selection transistor for driving the dummy cells are connected to each selection word line. Therefore, the number of actually functioning selection transistors 6 is (8×N+1) to (8×(N+1)).

Since two selection transistors share a main bit line, the number of main bit lines is ((8×N+1)/2) to ((L×N)/2). Since the number of main bit lines is a natural number, ((8×N+1)/2) can be represented as (4×N+1).

The semiconductor memory device of the first embodiment is different in structure from the semiconductor memory device of the second embodiment in that more than eight selection word lines are provided in the first embodiment, while eight selection word lines are provided in the second embodiment.

Providing more than eight selection word lines as in the first embodiment increases the size of a decoder circuit for driving the selection word lines. However, the gate width of the selection transistors 6 can be widened, whereby a driving current of the selection transistors 6 can be increased. In the case where eight selection word lines are provided as in the second embodiment, on the other hand, the size of the decoder circuit for decoding the selection word lines is the same as that in a conventional example. However, since the gate width of the selection transistors 6 is narrowed, a driving current of the selection transistors 6 is reduced. It is important to appropriately determine whether to use the structure of the first embodiment or the structure of the second embodiment by taking these advantages and disadvantages in consideration.

As has been described above, the semiconductor memory device of the present invention is capable of controlling the potential of all the bit line diffusion layers required for operation by the selection transistors in the case where the element isolation region is provided between the rewrite units of the memory cells. The semiconductor memory device of the present invention is therefore particularly useful for a MONOS memory.

What is claimed is:

1. A semiconductor memory device, comprising a memory cell array, wherein the memory cell array includes in a region defined by an element isolation region in a substrate:
   a plurality of bit line diffusion layers extending in a column direction in the substrate to form sub bit lines, the plurality of bit line diffusion layers are not coupled to one another;
   a plurality of word lines extending in a row direction over the substrate so as to cross the plurality of bit line diffusion layers;
   a plurality of memory cells each formed by a pair of bit line diffusion layers located adjacent to each other, a word line crossing a region interposed between the pair of bit line diffusion layers, and a gate insulating film formed between the substrate and the word line, and each sharing one of the plurality of bit line diffusion layers with an adjacent memory cell;
   a plurality of selection word lines extending in the row direction;
   a plurality of main bit lines extending in the column direction; and
   a plurality of selection transistors each having its gate connected to one of the plurality of selection word lines, its source connected to one of the plurality of bit line diffusion layers, and its drain connected to one of the plurality of main bit lines, for selecting any of the plurality of memory cells, wherein
   the plurality of memory cells are memory cell groups arranged in the column direction, each memory cell group consisting of (8×N) (where N is a natural number) memory cells arranged in the row direction as a unit to be used as a storage region,
   the element isolation region is provided between adjacent ones of the plurality of memory cells, and
   within one of the plurality of memory cells:
     the number of the plurality of selection word lines is at least eight,
     the number of selection transistors corresponding to at least N is connected to each of the plurality of selection word lines, and at least one selection transistor in addition to (8×N) selection transistors are connected in total to the plurality of selection word lines,
     the (8×N) selection transistors of the plurality of selection transistors are formed by (4×N) pairs of selection transistors having their respective gates connected to different selection word lines and having a common drain,
     the plurality of main bit lines includes at least one main bit line in addition to (4×N) main bit lines connected to the common drain of the pair of selection transistors, and
     each bit line diffusion layer of the plurality of memory cells is connected to the source of a corresponding one of the plurality of selection transistors.

2. The semiconductor memory device according to claim 1, wherein the number of the plurality of selection word lines is L=9 or 10, the number of the plurality of selection transistors is ((8×N)+1) to (L×N), and the number of the plurality of main bit lines is ((4×N)+1) to (L×N)/2.

3. The semiconductor memory device according to claim 1, wherein the number of the plurality of selection word lines is 8, the number of the plurality of selection transistors is ((8×N)+1) to ((8×N)+8), and the number of the plurality of main bit lines is ((4×N)+1) to ((4×N)+4).

4. The semiconductor memory device according to claim 1, wherein the plurality of memory cells includes at least one dummy cell that is not used as the storage region in each of the plurality of memory cell groups.

5. The semiconductor memory device according to claim 4, wherein the at least one dummy cell is provided at one end of each of the plurality of memory cell groups.

6. The semiconductor memory device according to claim 4, wherein the at least one dummy cell is two or more dummy cells and is provided at both ends of each of the plurality of memory cell groups.

7. The semiconductor memory device according to claim 4, wherein the at least one dummy cell is structured to be driven.

8. The semiconductor memory device according to claim 1, wherein the gate insulating film is a film having a charge trap function, and a gate electrode of the plurality of memory cells functions as a part of the word lines.

* * * * *